United States Patent [19]
Asai et al.

[11] Patent Number: 5,065,048
[45] Date of Patent: Nov. 12, 1991

[54] SEMICONDUCTOR LOGIC CIRCUIT WITH NOISE SUPPRESSION CIRCUIT

[75] Inventors: Mitsuo Asai, Kokubunji; Takehisa Hayashi, Kodaira; Toshio Doi; Kenichi Ishibashi, both of Kokubunji, all of Japan

[73] Assignee: Hitachi, Ltd., Tokyo, Japan

[21] Appl. No.: 397,199

[22] Filed: Aug. 23, 1989

[30] Foreign Application Priority Data

Sep. 19, 1988 [JP] Japan .................. 63-232379

[51] Int. Cl.$^5$ .................. H03K 19/12; H03K 19/092
[52] U.S. Cl. .................. 307/443; 307/446; 307/451; 307/481; 307/542; 307/546; 307/570; 307/572
[58] Field of Search .......... 307/443, 446, 448, 451, 307/480–481, 542, 516, 570, 572

[56] References Cited

U.S. PATENT DOCUMENTS

| 4,710,650 | 12/1987 | Shoji .................. 307/481 |
| 4,797,580 | 1/1989 | Sunter .................. 307/443 |
| 4,804,868 | 2/1989 | Masuda et al. .................. 307/446 |
| 4,837,463 | 6/1989 | Okitaka et al. .................. 307/443 |

FOREIGN PATENT DOCUMENTS

| 54-89558 | 12/1978 | Japan . |
| 59-2438A | 1/1984 | Japan . |
| 62-98827 | 5/1987 | Japan . |

OTHER PUBLICATIONS

1987 "High Speed Circuit Technology for Mainframe VLSI" Symposium on VLSI Circuit Uchida, et al. pp. 93–94.
Session IV: High-Speed Circuit Technology WAM 4,6: "Two CMOS 0.5 m 32b Digital Macros" by Chih-–Liang Cren et al. pp. 62–63.
1977 IEEE Solid State Circuit Conference "A CMOS Microprocessor for Telecommunication Applications" Cooper et al. pp. 138–139.

*Primary Examiner*—Stanley D. Miller
*Assistant Examiner*—Margaret Rose Wambach
*Attorney, Agent, or Firm*—Antonelli, Terry, Stout & Kraus

[57] ABSTRACT

A dynamic semiconductor logic circuit comprising a MOS FET logic section for effecting a high-speed logic operation in response to input logic signals after precharging of an output mode and internal nodes the logic section, a CMOS/BiCMOS output buffer section for outputting a result of the logic operation, and a noise suppression section for preventing erroneous operations without sacrificing the high-speed operation characteristic. The circuit, which is fabricated with 0.5-μm-rule technology and operates at high speed with a low-voltage power source of 4.5 V or less, has a precharging section for precharging the output node and internal nodes of the MOS FET logic section and a noise suppression section for latching the output node of the logic section to the source potential by feeding back the output of an output buffer section in order to enlarge the soft error margin. The latching current is held at less than a predetermined ratio to maintain the high-speed operation characteristic.

42 Claims, 16 Drawing Sheets

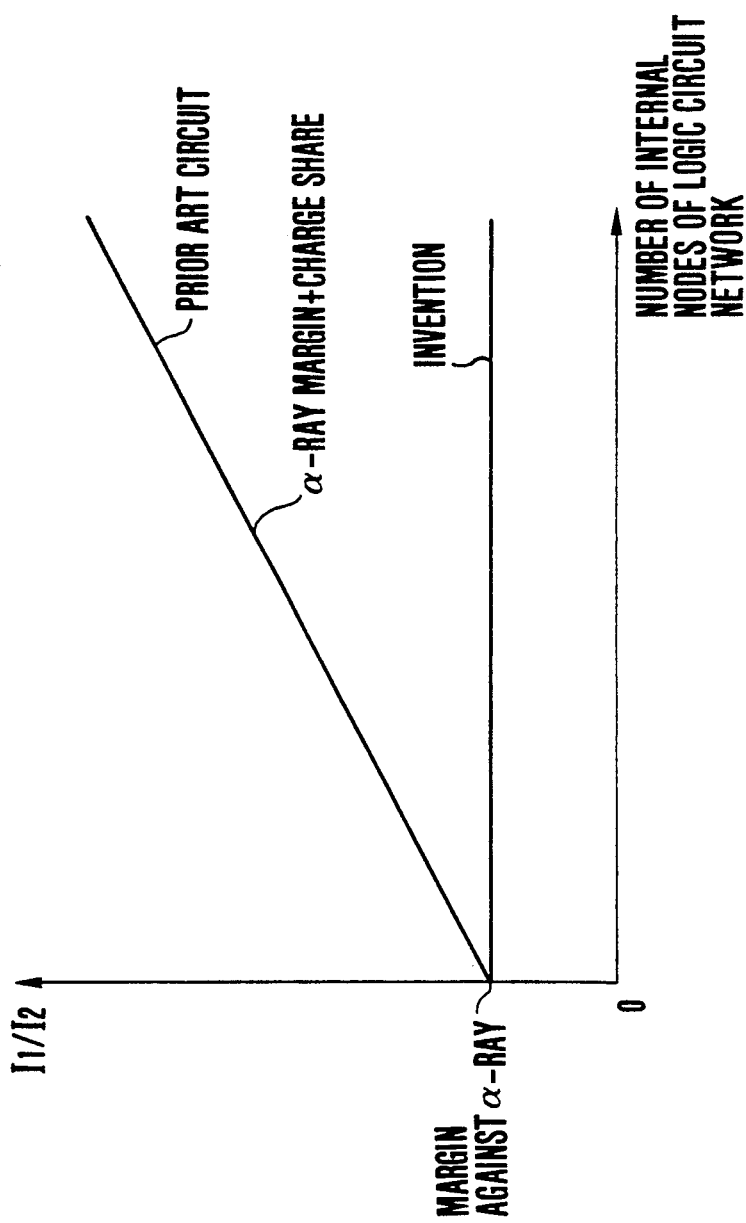

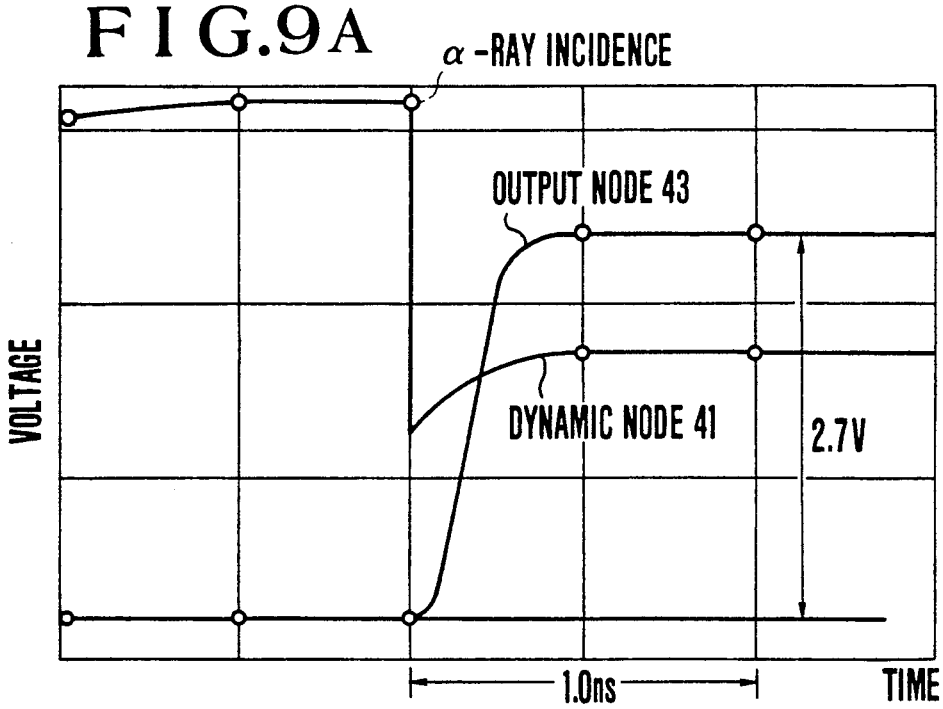
(a) ABSENCE OF NOISE SUPPRESSION CIRCUIT
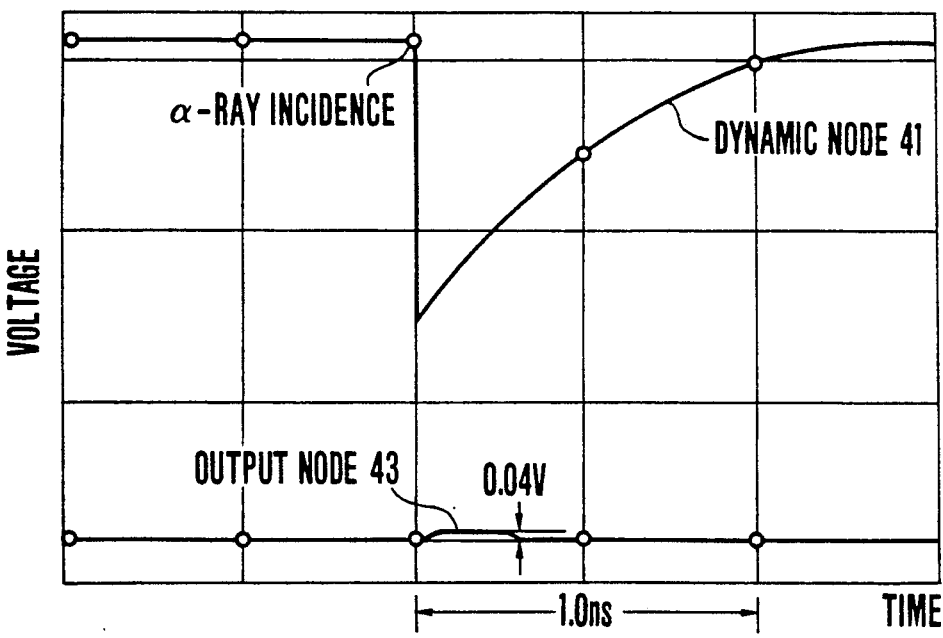
(b) PRESENCE OF NOISE SUPPRESSION CIRCUIT SIMULATION WITH INCIDENT α-RAY

EFFECT OF NOISE SUPPRESION CIRCUIT

COMPARISON OF PRECHARGING CIRCUIT DELAY TIME

SEMICONDUCTOR LOGIC CIRCUIT WITH NOISE SUPPRESSION CIRCUIT

BACKGROUND OF THE INVENTION

The present invention relates to the enlargement of a noise margin of a semiconductor logic circuit (LSI), or more particularly to a dynamic logic circuit suitable for large-scale integration with a soft error margin enlarged against α rays without sacrificing the high-speed operation characteristics of CMOS and BiCMOS logic circuits in the LSI.

A high-speed logic circuit for MOS LSI comprising a logic section configured of MOS FETs for effecting a predetermined logic operation by dynamic action and a CMOS or BiCMOS output buffer for outputting the result of the logic operation is well known, as disclosed in JP-A-54-89558, JP-A-62-98827 and JP-A-59-2438.

Generally, the operation of a dynamic logic circuit includes a precharging operation for making preparations before performing logic operation and a subsequent operation. These operations are performed in the manner mentioned below in a conventional system shown in FIG. 1A. (Reference is made, for example, to SESSION IV: HIGH-SPEED CIRCUIT TECHNOLOGY WAM 4,6: "TWO (MOS 0.5 μm 326 Digital Macros" by Chih-Liang Chen et al. IBM Research Center pp. 62–63, 1987 IEEE ISCC, or U.S. patent application Ser. No. 07/246,196, entitled "Semiconductor Logic circuit" filed on Sept. 19, 1988 and assigned to the same assignee as the present invention.)

First, for performing the precharging operation, a clock signal input terminal 51 is set to the ground potential (hereinafter assumed to be "low level"). As a result, a PMOS FET 1 is turned on and NMOS FET 19 off. In the meantime, input signals A to E are set to low level by a circuit not shown in the diagram. An output node of a logic section 61 (dynamic node) 41 is charged to a source potential (hereinafter referred to as "high level") by the PMOS FET 1, so that a PMOS FET 6 turns off and an NMOS FET 7 turns on, thus reducing the output terminal 43 to low level.

Now, the logic operation will be explained. When the clock signal input terminal 51 is set to high level, the PMOS FET 1 turns off and the NMOS FET 19 turns on. If current conduction takes place between the logic section output node 41 and the grounded terminal by data inputs to the input terminals A to E, electric charges stored at the node 41 by the precharging operation are discharged to the ground, and the potential of the same node drops, whereupon the PMOS FET 6 turns on and the NMOS FET 7 turns off. Thus a parasitic capacitor 102 is charged through the PMOS FET 6, and the output terminal 43 increases to high level, thus completing the logic operation.

The charges stored at the logic section output node 41 are charged also to a parasitic capacitance 101 mainly including a wiring capacitance and a gate capacitance of the PMOS FET 6 and the NMOS FET 7. Through study of these circuits, the attention of the present inventors was drawn to facts mentioned below.

The quantity of noise charges due to alpha (α) rays has not posed a problem in the past in comparison it is small as with the quantity of charges stored at the parasitic capacitance. With the reduction in size of integration circuits and the resulting decrease in the capacitance thereof, however, the quantity of the charges stored in the capacitance has also decreased, thereby making it difficult to ignore the quantity of noise charges due to alpha rays. The problem has thus come up in which the logic is reversed by noise charge when alpha ray is bombarded on a transistor. This problem becomes more important with the decrease in source voltage which decreases the quantity of charges to the capacitance.

Another conventional circuit is shown in FIG. 2. This circuit has a PMOS FET 50 (feedback PMOS) add to the conventional circuit of FIG. 1A. In the circuit of FIG. 2, the problem of charge share may be solved by increasing the gate width of the PMOS FET 50, but the rate of delay in logic operations increases rapidly with the increase in the gate width of the PMOS FET 50. Specifically, as taken up at the 1987 Symposium on VLSI Circuits, Karuizawa, (High-Speed on VLSI Circuit for Mainframe VLSI, p. 93 to 94) which dealt with the use of the circuit shown in FIG. 2 for solving the problem of charge share, the increase in the gate width of the PMOS FET 50 gives rise to the problem of rapidly increasing the rate of computation delay. The above cited paper deals only with a measure against such a charge share problem and does not recognize or offer any solution to the soft error problem caused by x particles.

SUMMARY OF THE INVENTION

The primary object of the present invention is to prevent soft errors due to the incidence of alpha rays which poses a special problem in a dynamic semiconductor logic circuit reduced in size and adapted for a high-speed operation with a low-voltage power source, and thus to provide a dynamic semiconductor logic circuit having an enlarged noise margin without sacrificing the high-speed operation characteristic.

Another object of the present invention is to enlarge the soft error margin without sacrificing the high-speed operation characteristic of a CMOS/BiCMOS dynamic semiconductor logic circuit reduced in size and adapted for a high-speed operation with a low-voltage power source.

Still another object of the invention is to provide a dynamic semiconductor logic circuit reduced in size and adapted for a high-speed operation with a low-voltage power source by comprising α-particle noise suppression means for enlarging the soft error margin and precharge limiting means for maintaining the high-speed operation characteristic.

A further object of the present invention is to provide a dynamic semiconductor logic circuit fabricated by application of a 0.5 μm rule technology which is capable of a high-speed operation with a low-voltage power source of 4.5 V or less, and which has a high practical value with a soft error margin enlarged without sacrificing the high-speed operation characteristic thereof.

A still further object of the invention is to provide various forms of CMOS/BiCMOS dynamic semiconductor logic circuits reduced in size and adapted for a high-speed operation with a low-voltage power source which has the enlarged soft error margin.

According to one aspect of the present invention, there is provided a dynamic semiconductor logic circuit comprising MOS FET logic means having a high-speed operation characteristic for performing logic operation in accordance with input signals after a precharging operation responding to a clock signal, output buffer means for outputting a result of the logic operation, and means for performing the precharging operation. The precharging means includes means for precharging at least an internal node and an output node of the logic means to high level in response to the clock signal in order to enlarge the soft error margin without sacrificing the high-speed operation characteristic of the logic means. For this purpose, the precharging means also includes feedback means for latching the output node or the logic means (logic section output node) to a predetermined high level in response to an output signal of an output buffer means during the precharging operation. The feedback means is made so as to limit a current to a value below a predetermined level for the latching of the logic section output node to the high level as compared with a current value extracted from the logic section output node during the logic operation mode of the logic means. The limitation of the latching current is effected by adjusting or particularly selecting gate width of a MOS FET of the feedback means.

BRIEF DESCRIPTION OF THE DRAWINGS

FIG. 7 is a graph plotted with the abscissa of the number of internal nodes of a logic circuit network and the ordinate of the ratio $I_1/I_2$ indicating the drivability of the feedback PMOS FET during the computation operation necessary against charge share and alpha ray noises.

FIGS. 9A and 9B are digrams illustrating advantages of the noise suppression of the present invention by comparing cases of the absence and the presence of the present invention.

DESCRIPTION OF THE PREFERRED EMBODIMENTS

In view of the object of the present invention of preventing soft errors due to incident alpha rays in a very fine-scaled dynamic semiconductor logic circuit adapted for a high-speed operation with a low-voltage power supply, problems of soft error will be first explained prior to the explanation of the embodiments to clarify the problems which are solved by the present invention.

Figure 3A:
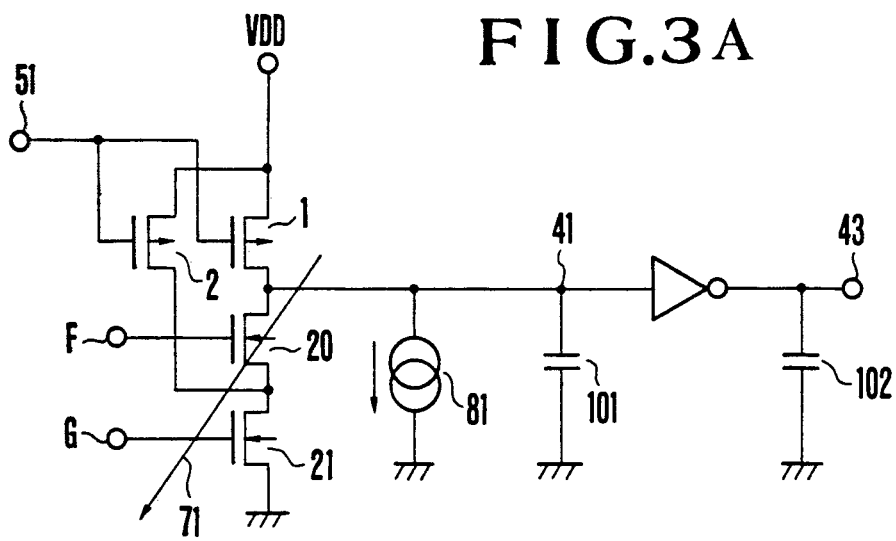
FIG. 3A is a conventional circuit diagram for explaining the primary subject to be solved by the present invention.
Figure 3B:
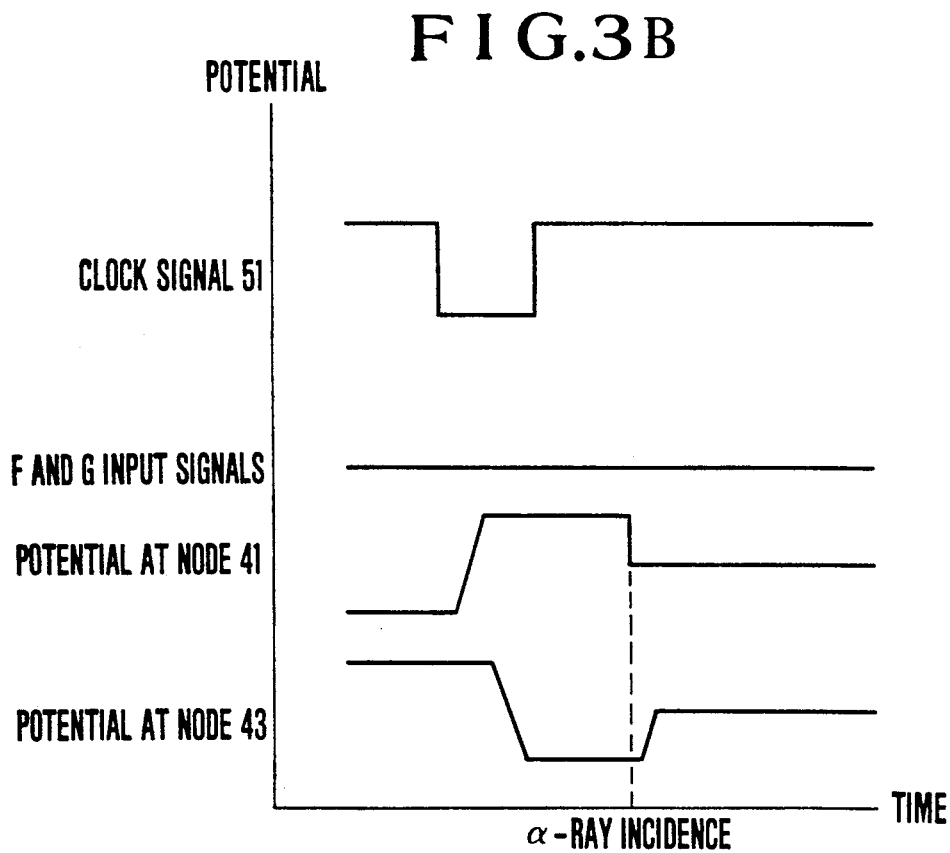
FIG. 3B shows waveforms produced at various nodes in the circuit of FIG. 3A.

A phenomenon of a soft error occurring due to alpha rays in a dynamic semiconductor logic circuit is explained with reference to FIG. 3A, showing a logic circuit for effecting the logic operation of (F·G) corresponding to input signals F to G. Assuming that a clock signal 51 is at low level, a precharging operation is effected and a logic section output node (dynamic) 41 becomes high in level, and an output node 43 of an output buffer is reduced to low level. Then assume that a clock signal input terminal 51 is at high level. The computation operation is initiated. If an alpha ray 71 passes the diffusion layer of the drain of an NMOS FET 20 when an input signal F or G is at low level, electrons generated by the alpha ray are collected at the same drain. As a result, the potential of the node 41 drops as shown in the waveforms of the circuit in FIG. 3B. This phenomenon results in extracting electric charges from the node 41 as shown in the equivalent circuit of a current source 81. The voltage drop of the node 41 may cause a false operation in which the output remains at high level in spite of the computation result input being low in level.

Figure 1A:
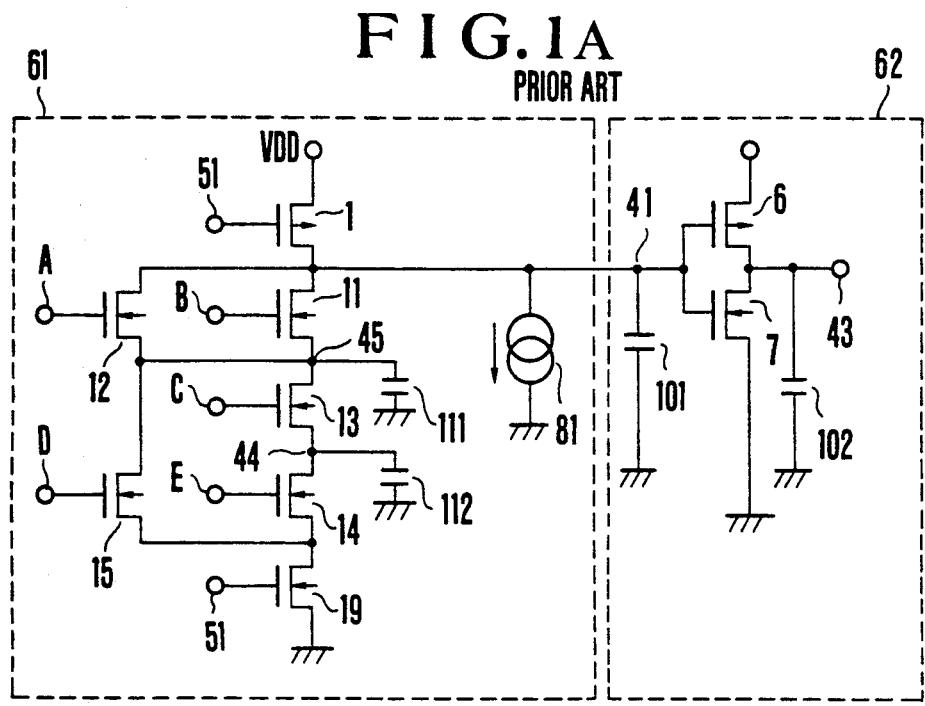
FIG. 1A is a diagram showing one type of a conventional circuit.
Figure 1B:
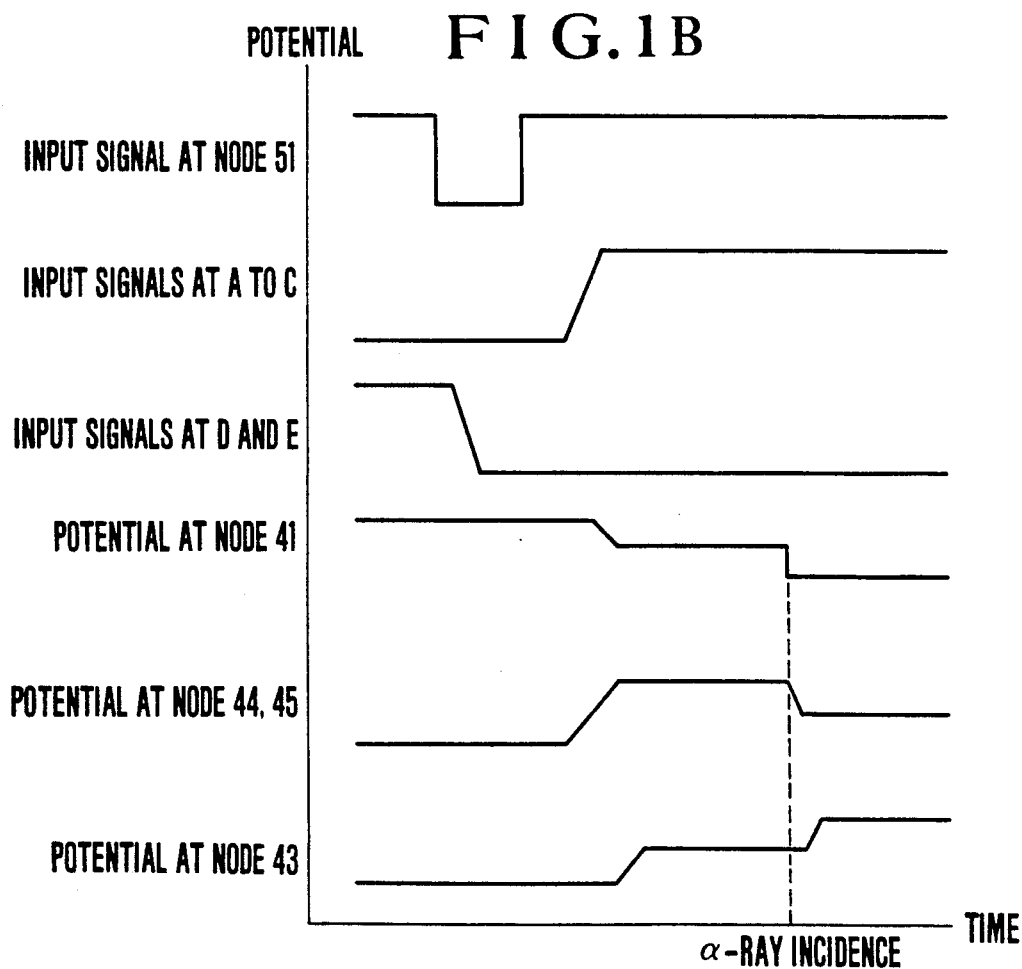
FIG. 1B shows waveforms of various nodes of the circuit shown in FIG. 1A.

In the conventional circuit shown in FIG. 1A, the internal nodes 44 and 45 of the logic section 61 are not necessarily always charged to high level by the precharging operation of a PMOS FET 1. As seen from FIG. 1B showing voltage waveforms produced at each node of the circuit in FIG. 1A, the internal nodes 44 and 45 of the logic section remain at low level after a precharging operation following a computation executed for low-level input signals A to C and high-level input signals D to E. In the next computation operation when current conduction fails to take place between the logic section output node 41 and the ground with the input signals A to C at high level and the input signals D and E at low level, the NMOS FETs 11, 12 and 13 turn on and NMOS FETs 14 and 15 turn off, thus connecting the nodes 41, 44 and 45. As a result, the charges stored in the parasitic capacitance 101 are divided between the parasitic capacitances 111 and 112, and therefore the potential of the node 41 drops (charge shared). If an alpha ray passes the drain of the NMOS FET 11 under this condition, the node 41 drops further in potential. Some measure is necessary to prevent these voltage drops from causing a high-level output of the node 43. For example, the parasitic capacitance 101 should be increased or the input-output characteristic of the inverter of the output buffer section 62 should be appropriately adjusted to maintain the output of the node 43 at low level even against such a voltage drop. As part of this measure, the gate of the NMOS FET 7 of the output buffer 62 should be constructed geometrically wider than that of the PMOS FET 6. In any case, the present inventors have recognized the problem that it is inevitable to sacrifice the computation (logic operation) speed in order to procure a necessary soft error margin.

Conventionally, the aforementioned problem has not so far been considered serious for dynamic logic circuits having large capacitances of dynamic nodes (logic section output node) for dynamic operation in comparison with that of memories. With recent progress in fine scaling of integration circuits, however, it usually happens that the increase in device size by a factor of 1/k results in an increase in gate capacitance by a factor of 1/k. The 0.5 μm technique for reducing the gate length of the MOS FET to 0.5 μm, therefore, as compared with the 0.8 μm technique, reduces the capacitance of such a dynamic node by approximately 60%. The result is that with the size reduction, the circuit becomes more vulnerable to charge noise such as that which is due to alpha ray.

Further, the technology for less than 0.5 μm requires a source voltage to be reduced due to the reduction in breakdown voltages of transistors (performance deterioration due to hot electrons).

The present inventors have recognized that dynamic semiconductor logic circuits fabricated in accordance with 0.5-μm-rule technology instead of 0.8-μm-rule and adapted for operation with a source voltage of less than 4.5 V instead of 5 V, have a reduced quantity of charges to the node 41 while the quantity of noise charges due to alpha rays becomes relatively large, and therefore they are not practically applicable. In view of this fact, the inventors have established the novel subject of enlarging the soft-error margin of such a fine-scaled logic circuit and providing circuit configurations which can find practical applications.

Figure 4A:
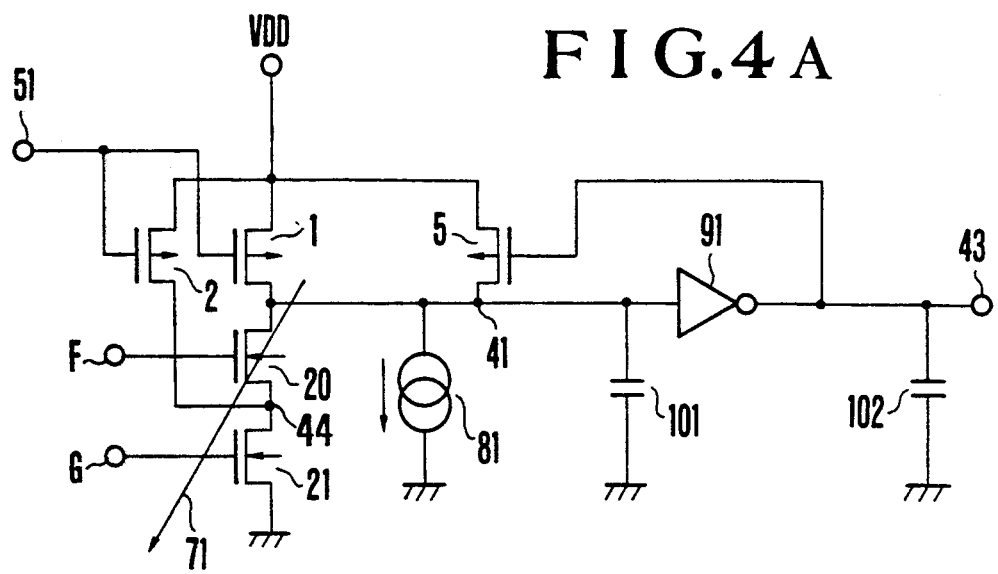
FIG. 4A is a diagram showing a basic configuration of the present invention.
Figure 4B:
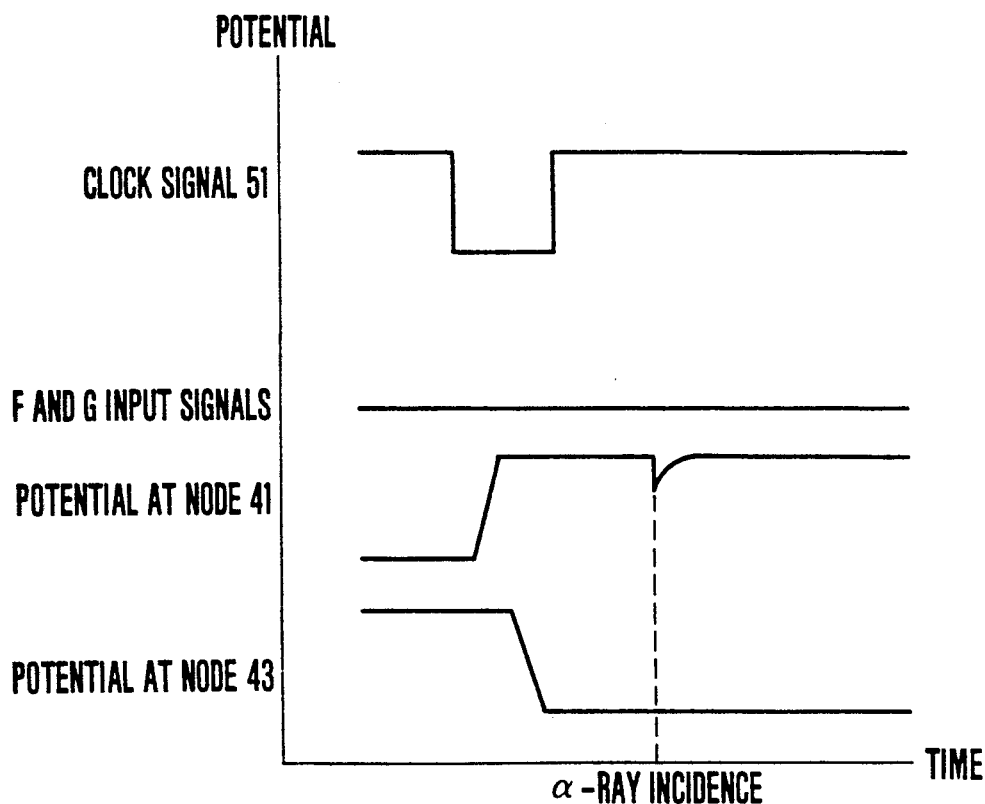
FIG. 4B shows waveforms produced at various parts of the circuit shown in FIG. 4A.

A basic form of the present invention will be explained with reference to FIGS. 4A and 4B. In FIG. 4A, numerals 1, 2 and 5 designate PMOS FETs numerals 20 and 21 NMOS FETs, numeral 91 an inverter for an output buffer section, numerals 101 and 102 parasitic capacitances, numeral 71 an alpha ray, numeral 81 an alpha-ray noise equivalent circuit, numeral 51 a clock signal input terminal, and characters F and G data signal input terminals. FIG. 4B shows examples of waveforms of each node potential in the circuit of FIG. 4A. According to this aspect of the invention, not only the logic section output node 41 but also the internal node of the logic circuit (junction points of a plurality of MOS FETs making up the logic circuit network) are precharged to a high level, thereby preventing a voltage drop of the logic section output node 41 due to the charge share. Also, the logic section output signal is latched at a high level by the feedback PMOS 5, so that even if a voltage drop occurs due to an alpha ray, the soft error is prevented by the immediate charging as shown by the potential waveform of the node 41 in FIG. 4B. A high-speed computation can also be effected since the charging PMOS FET 5 may be well fabricated to a very low performance level.

According to this aspect, the precharging operation enables not only the logic section output node 41 but also the internal nodes of the logic circuit network to be charged at high level, and thus eliminates the voltage drop of the logic section output node 41 due to the charge share while at the same time latching the logic section output node 41 at a high level by the feedback PMOS FET 5. As a result, the driving force of the feedback PMOS FET 5 may be preferably taken into account only for the elimination of the alpha ray noise and can be made very small in size. The soft error is thus prevented while enabling a high-speed computation.

Figure 2:
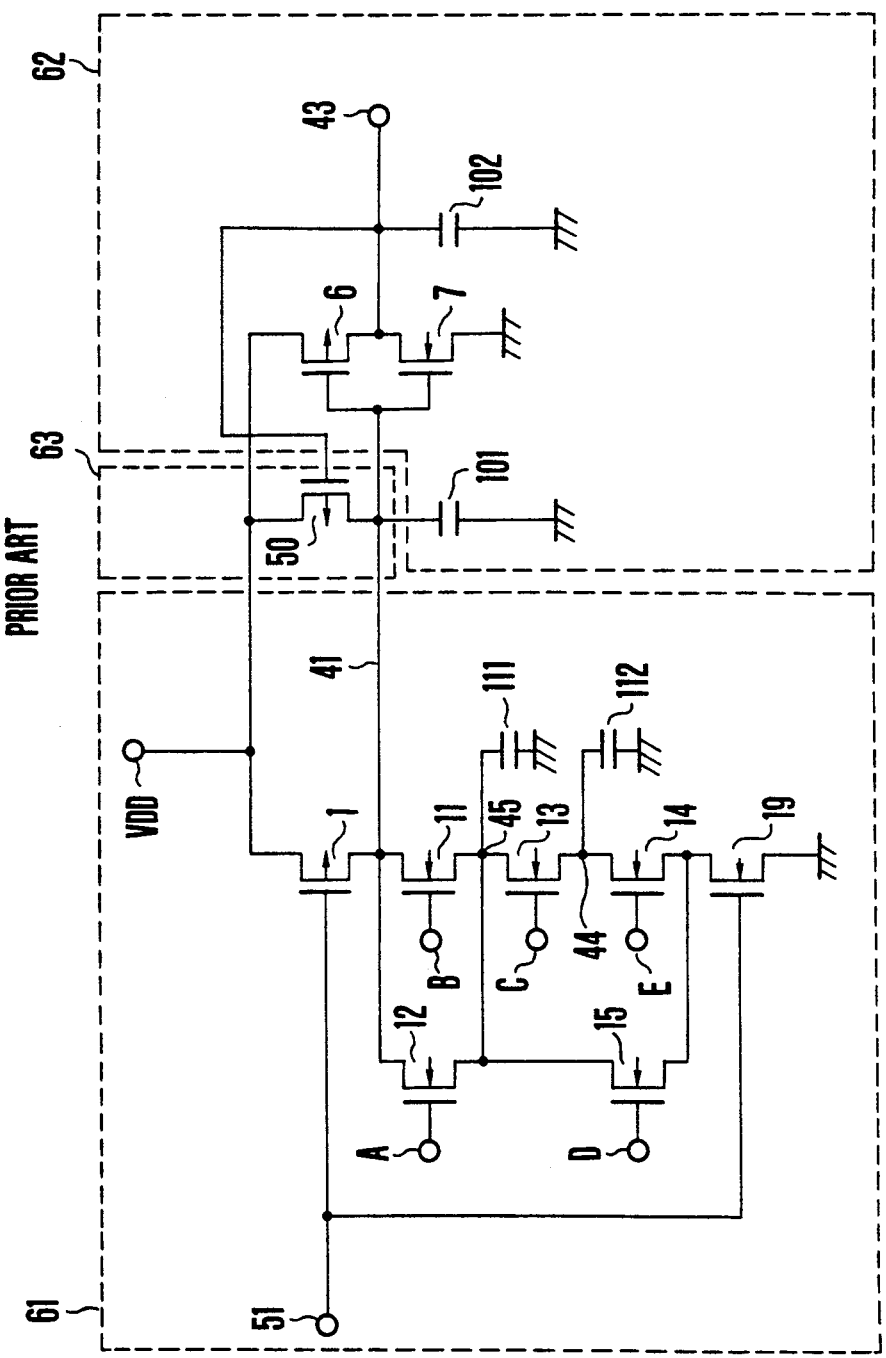
FIG. 2 is a diagram showing another type of conventional circuit.

In the case where the internal nodes 44 and 45 of the logic circuit network are not precharged at high level but the logic section output node 41 is only latched to high level by the feedback PMOS FET 50 as in the conventional circuit shown in FIG. 2, measures are necessary against both the voltage drop of the node 41 due to the charge share and that due to alpha ray. It is thus necessary to procure the driving force of the feedback PMOS FET 50 for both the margins against the alpha noise and that against the charge share. Also, the greater the number of internal nodes of the logic circuit network, the greater the voltage drop of the logic section output node due to the charge share. As a result, a greater driving force of the feedback PMOS FET 50 and hence a greater gate width of the PMOS FET 50 is required. This leads to a greater delay of the output inverter, thereby greatly delaying the computation speed. According to the present invention, as shown in FIG. 4A, the internal nodes as well as the output node 41 of the logic section are charged to high level by the PMOS FETs 1 and 2 as a precharging operation, and therefore the voltage drop of the logic section output node due to the charge share is eliminated, so that the driving force of the feedback PMOS FET 5 can be preferably set only as necessary to resolve the problem of alpha ray noise.

Figure 5A:
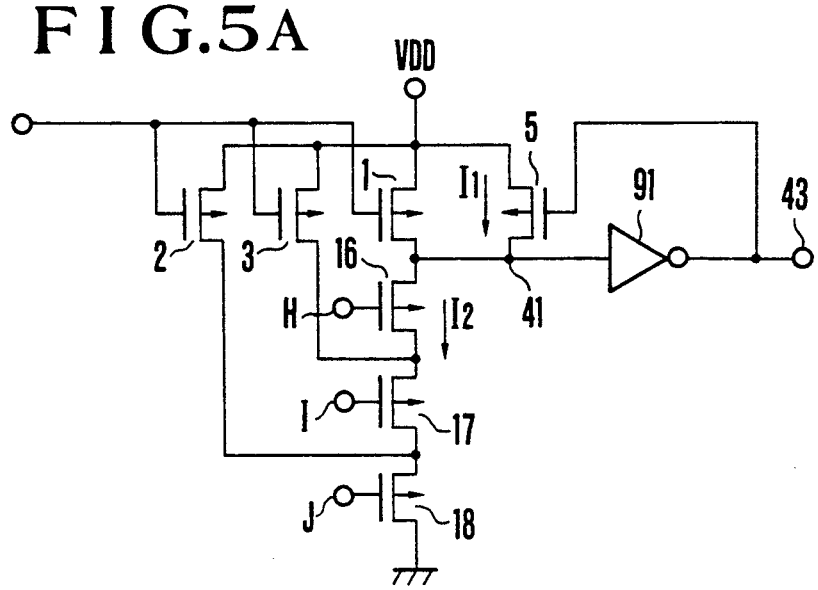
FIGS. 5A and 5B respective show a circuit diagram and a graph to explain a relation of the drivability of a feedback PMOS FET and a delay time characteristic in the logic operation.
Figure 5B:
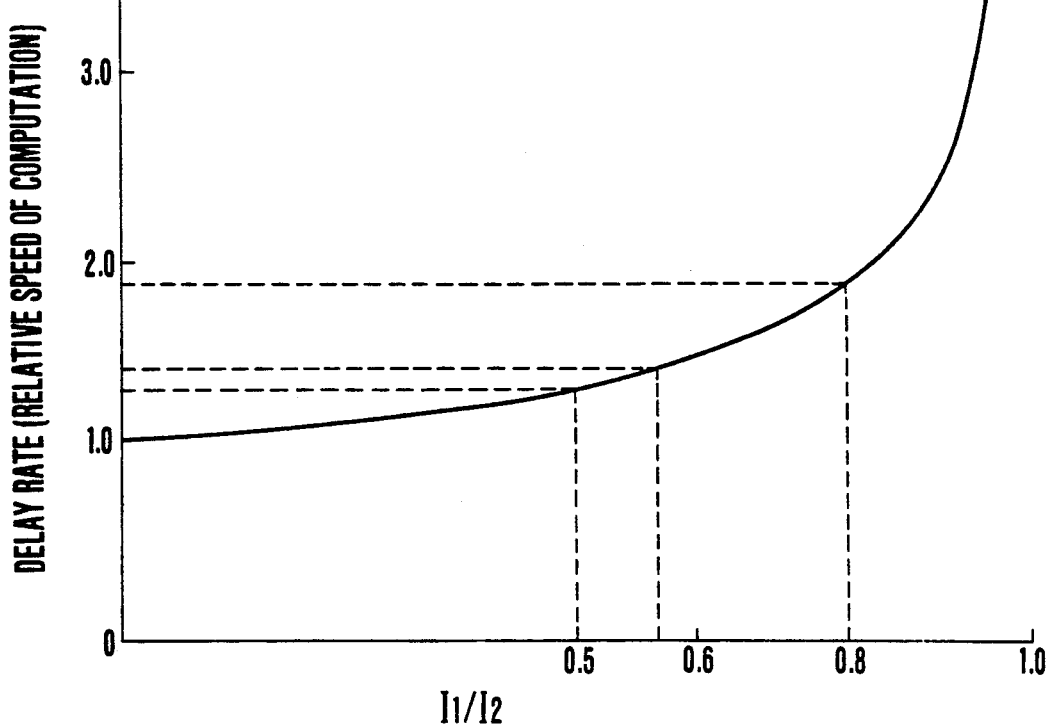

FIGS. 5A and 5B are a circuit diagram and a graph, respectively to illustrate a relation of a delay time characteristic of logic operation and a drivability ($I_1/I_2$) of a feedback PMOS FET 5 which are changed with changes of gate width of the PMOS FET 5. In FIG. 5B the abscissa represents the ratio of $I_1/I_2$ and the ordinate represents relative values of the associated computation speed. FIG. 5B indicates that with the increase in the ratio $I_1/I_2$ representing the drivability of the feedback PMOS FET 5, the computation speed is rapidly decreased. According to the present invention, this current ratio is set to a low level. Specifically, by way of reference, $I_1$ designates a current flowing in the drain-source circuit of the PMOS FET 5 when the gate voltage is at low level and the drain-source voltage is VDD, and $I_2$ designates a current flowing in the NMOS FET 16 when the node 41 is at VDD potential and the input terminals H to J are at high level. Since the internal nodes of the logic circuit network are charged to a high level in a precharging operation, the voltage drop of the logic section output node 41 due to the charge share is eliminated, and therefore the driving force of the feedback PMOS FET 5 can preferably be selected only to bring about the elimination of alpha ray noise. FIG. 6B is a graph plotting the driving force $I_1/I_2$ of the feedback PMOS FET 50 on the abscissa and the ratio $\Delta V_n/VDD$ on the ordinate where $\Delta V_n$ is a voltage drop of the logic section output node 41 due to the charge share and VDD is a source voltage in the conventional circuit shown in FIG. 6A where the potential of the logic section output node drops due to charge share.

Figure 6A:
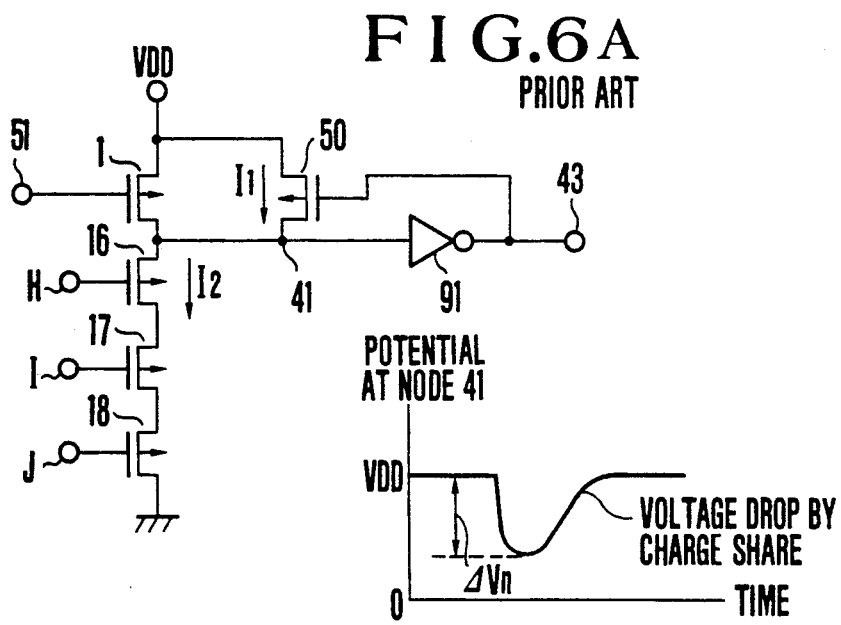
FIG. 6A is a conventional circuit diagram and FIG. 6B is a graph plotted with the abscissa of the ratio $I_1/I_2$ indicating the drivability of its feedback PMOS FET and the ordinate of the ratio of the voltage drop at the logic section output node to the source voltage by charge share.
Figure 6B:
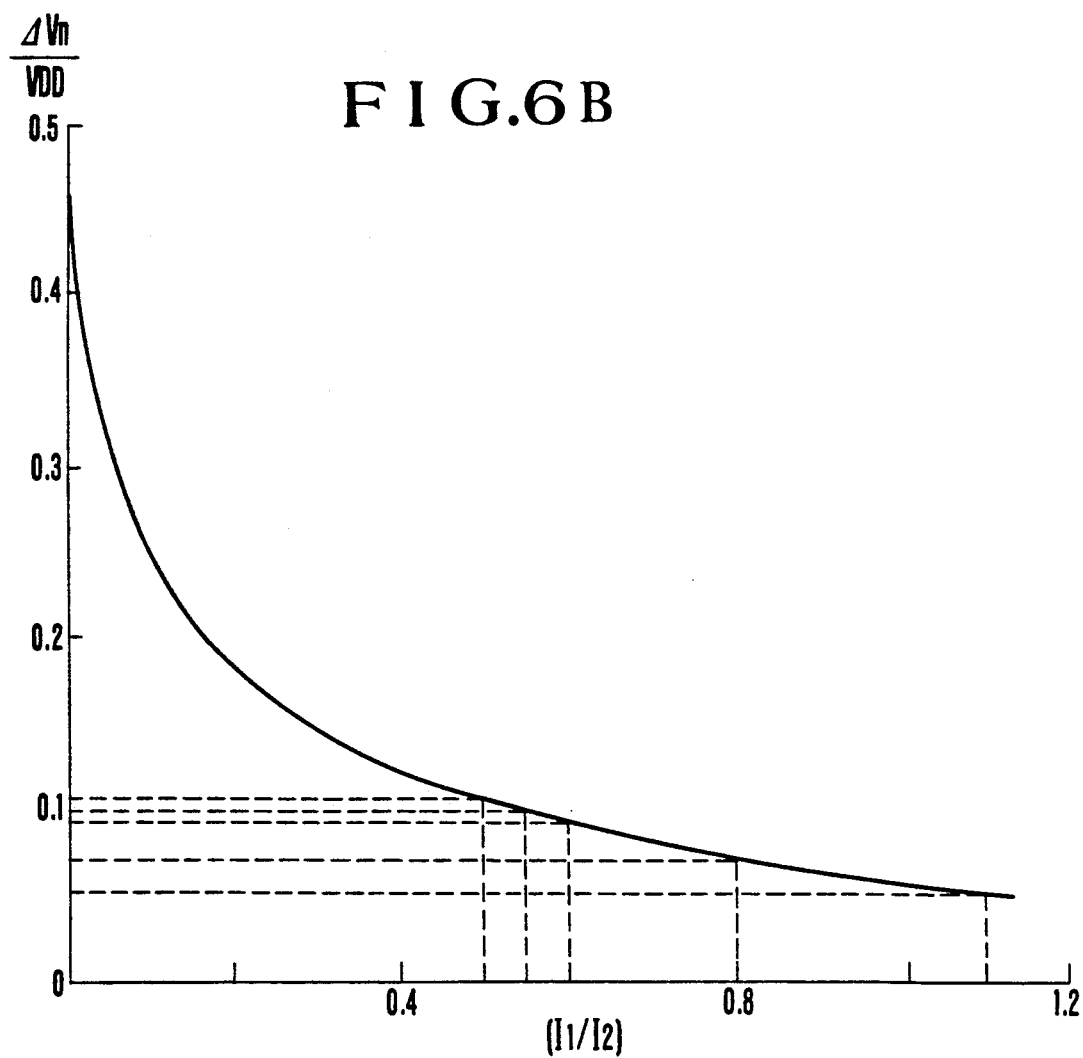

As clear from FIG. 6B, in the conventional circuit of FIG. 6A, if the ratio $\Delta V_n/VDD$ is to be set to less than 10%, it is necessary to set the driving force $I_1/I_2$ of the feedback PMOS FET 50 to more than approximately 50%. Further, in order to keep the ratio $\Delta V_n/VDD$ at less than 5% (as desirable when taking noises from the power source line and crosstalks between signals into consideration), it is necessary to set the ratio $I_1/I_2$ to more than 110%. If the ratio $I_1/I_2$ is set to a high level, however, the computation speed is considerably decreased as shown in FIG. 5B. According to the present invention, the ratio $I_1/I_2$ can be set to a small value such as less than approximately 60% accompanied by only a small decrease in computation speed, by virtue of the elimination of the voltage drop of the logic section output node due to charge share. The graph of FIG. 7, on the other hand, is plotted with the number of internal nodes of the logic circuit network on the abscissa and the driving force $I_1/I_2$ of the feedback PMOS FET required for charge share and alpha ray on the ordinate with respect to a circuit according to the present invention and a conventional circuit. As seen from FIG. 7, according to the present invention, the driving force of the feedback PMOS FET can be well set only to eliminate the alpha ray noise even in a circuit having many internal nodes of the logic circuit network.

Figure 8A:
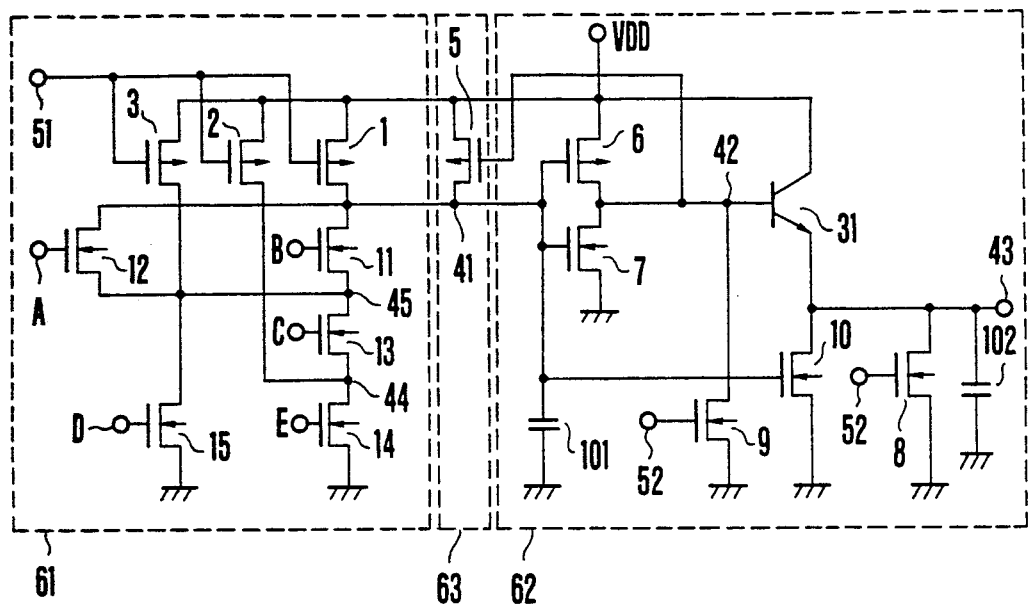
FIG. 8A is a diagram showing a dynamic logic circuit according to an embodiment of the present invention.
Figure 8B:
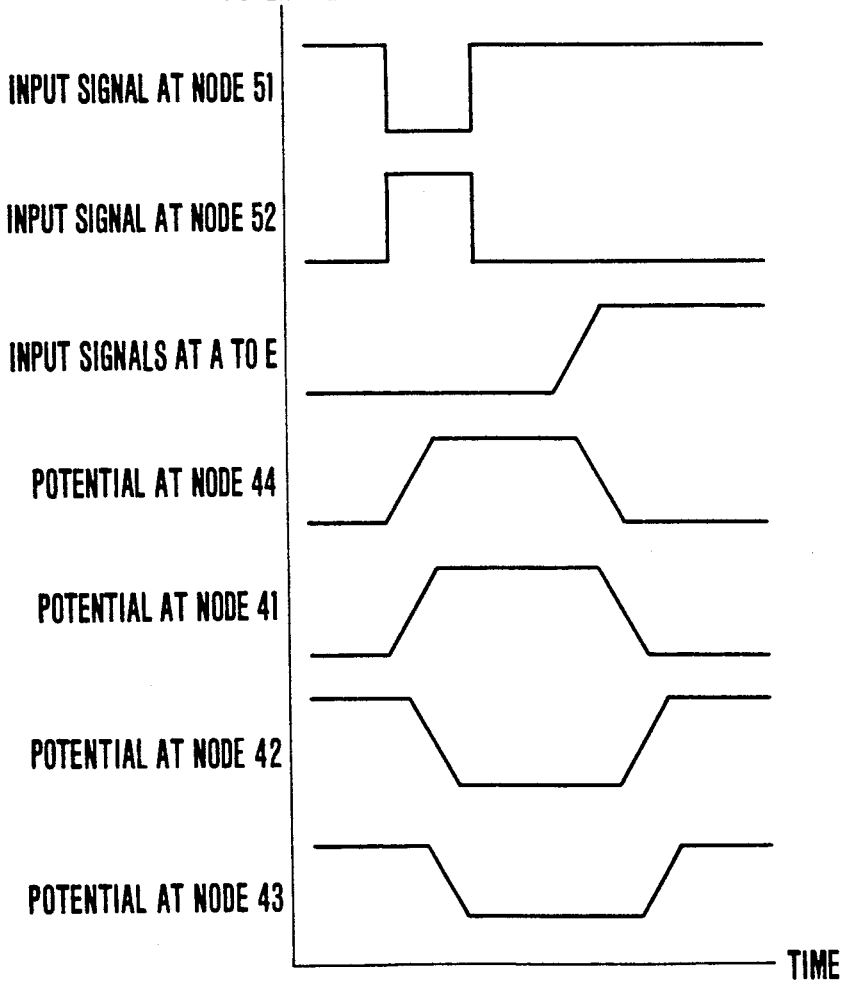
FIG. 8B shows waveforms representing the operation of the same logic circuit.

In FIG. 8A, which shows an embodiment of the present invention, numerals 1 to 3, 5 and 6 designate PMOS FETs, numerals 7 to 15 NMOS FETs, numeral 31 an NPN-type bipolar transistor, numeral 41 a logic section output node (dynamic node), numerals 44 and 45 internal nodes of the logic circuit network, numeral 42 an internal node of the output buffer section, numerals 51 and 52 clock signal input terminals, characters A to E data signal input terminals, numeral 43 an output signal terminal, numeral 61 a logic section, numeral 62 an output buffer section, numeral 63 a feedback PMOS, numerals 101 and 102 parasitic capacitances such as wiring capacitance and gate capacitance, and characters VDD a power terminal. Although the embodiment under consideration is so configured that the result of logic operation of $(A+B) \cdot (C \cdot E+D)$ is applied to the output terminal 43, the configuration of the logic section 61 may be modified to realize a logic circuit for the desired logic operation. FIG. 8B shows waveforms produced at various parts of the circuit according to the embodiment of FIG. 8A. The circuit operation will now be explained with reference to these drawings.

First, a precharging operation is performed with the clock signal terminal 51 at low level and the terminal 52 at high level. In the process, the input signals A to E are set to a low level by a circuit which is not shown. These input signals turn on the PMOS FETs 1 to 3 and NMOS FETs 8 and 9 and turn off the NMOS FETs 11 to 15, so that the parasitic capacitance 101 of the logic section output node 41 is charged through the precharge PMOS FET 1, thereby urging the node 41 to high level. The internal nodes 44 and 45 of the logic section, on the other hand, are urged to high level through the precharge PMOS FETs 2 and 3. As a consequence, the PMOS FET 6 is turned off and the NMOS FETs 7 and 10 are turned on. Since the NMOS FET 9 is on, on the other hand, the internal node 42 of the output buffer 62 turns to low level, while the feedback PMOS FET 5 is turned on. Also, the NPN-type bipolar transistor 31 turns off, and the output node 43 is discharged to low level through the NMOS FETs 8 and 10.

As a result of the clock signal input terminal 51 being turned to high level and the terminal 52 decreased to low level, the PMOS FETs 1 to 3 and NMOS FETs 8 and 9 are turned off thereby to start the computation process. If a high-level signal is applied to the whole or a part of the data signal input terminals A to E in such a manner as to energize the circuit between the node 41 and the ground, the charges of the parasitic capacitance 101 are discharged thereby to decrease the potential of the node 41. The result is that the PMOS FET 6 turns on and the NMOS FETs 7 and 10 turn off, with the node 42 increased in potential and the bipolar transistor 31 turned on. Also, the PMOS FET 5 turns off. The parasitic capacitance 102 is then charged through the bipolar transistor 31 from the VDD.

Further, after the node 41 is charged to high level by the precharging operation, the logic computation is started, and when the conduction between the node 41 and the ground is cut off by input signals A to E, noise electrons which may be generated with the occasional passage of alpha rays through the drain of the NMOS FET 11 are captured at the same drain.

As a consequence, the potential of the logic section output node (dynamic node) 41 drops. Since the pulse duration of the voltage drop is of a spiked waveform which is very short as compared with those of the normal circuit operation, however, the noise current from the node 41 to the substrate due to the incident alpha ray expires before the CMOS responds in the inverter stage. In the meantime, the feedback PMOS FET 5 remains conducting, and the potential of the node 41 that has once dropped is restored by charging through the PMOS FET 5, thus reducing the possible noise voltage of the inverter stage.

In this way, according to the present invention, the potential drop of the node 41 caused by noise electrons of alpha ray is restored immediately by charging through the PMOS FET 5, and therefore a faulty operation is prevented thereby to improve the alpha ray noise margin greatly.

Furthermore, by virtue of the fact that the driving force of the feedback PMOS FET may be set only eliminate the alpha ray noise according to the present invention, it is not necessary to increase the driving force of the feedback PMOS even for a circuit having complicated computation logic and many internal nodes of a logic circuit network. In this embodiment, the ratio $I_1/I_2$ indicating the driving force of the feedback PMOS may be set to as small a value as less than 60% even for a circuit having many internal nodes of a logic circuit network.

FIGS. 9A and 9B show advantages of a noise suppression circuit according to the present invention as compared through simulation. FIG. 9A shows a case lacking in the noise suppression circuit, in which the potential of the logic output node (dynamic node) 41, once decreased by incident alpha ray, cannot be restored, and therefore the potential at the output node 43 increases, thereby causing a faulty operation. FIG. 9B, on the other hand, shows a case of the present invention of FIG. 8A comprising the noise suppression circuit. In this circuit, in spite of the potential of the logic section output node (dynamic node) 41 being decreased immediately after entrance of an alpha ray, the potential drop is immediately restored by the feedback PMOS FET 5, so that the noises appearing at the output node 43 are reduced to a level not causing any false operation.

This noise suppression effect is not limited to a dynamic logic circuit having a BiCMOS inverter for the output buffer as shown in FIG. 8A, but is also obtained in a dynamic logic circuit using a CMOS inverter at the output buffer.

Figure 10:
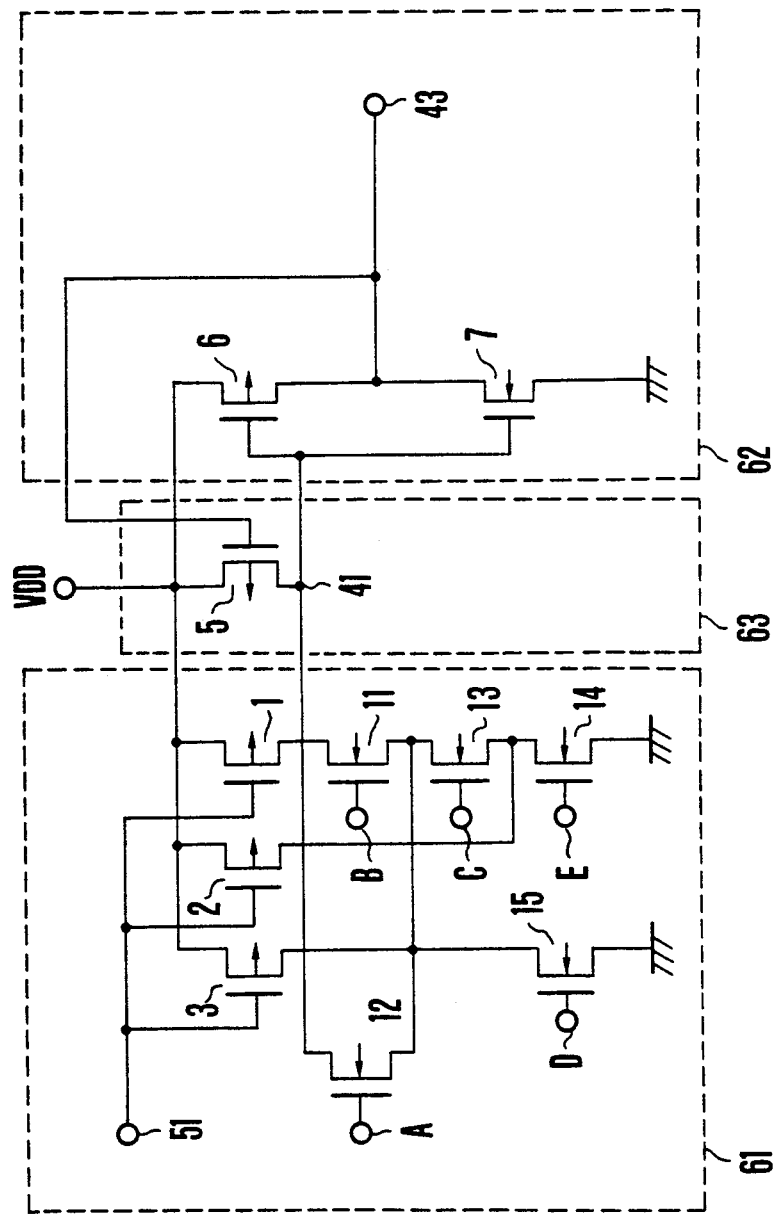
FIG. 10 is a diagram showing an embodiment of the present invention using a CMOS inverter in the output buffer portion.

FIG. 10 shows an embodiment of the present invention using a CMOS static inverter at the output buffer. A CMOS static inverter including a PMOS FET 6 with the drain connected to the output node 43, the gate to the logic section output node 41 and the source to VDD and a NMOS FET 7 with the drain connected to the output node 43, the gate to the logic section output node 41 and the source to the ground is used as an output buffer 62. This buffer 62, together with a logic section 61 and a feedback PMOS FET 63 including a PMOS FET 5 with the drain connected to the logic section output node 41, the gate to the output node 43 and the source to VDD, constitutes the embodiment under consideration. During the precharging operation, a clock signal 51 is set to low level, and the logic section output node 41 and the internal nodes of the logic circuit network are charged to high level. As a result, the PMOS FET 6 is turned off and the NMOS FET 7 turned on, and the NMOS FET 7 discharges the output node 43, thereby reducing the output to low level. When the clock signal 51 is raised to high level, the computation operation is started. Upon current conduction between the logic section output node 41 and the ground by the input signals A to E, the node 41 drops in potential. Within a short time, the PMOS FET 6 is turned on and the NMOS FET 7 turned off, and therefore the potential at the output node 43 increases to high level. At the same time, the PMOS FET 5 is turned off. The effect of precharging the internal nodes of the logic circuit network and latching the logic section output node by the feedback PMOS is the same as in the above-mentioned embodiment. Since these functions can be secured in a small area, a high degree of integration is made possible.

Figure 11:
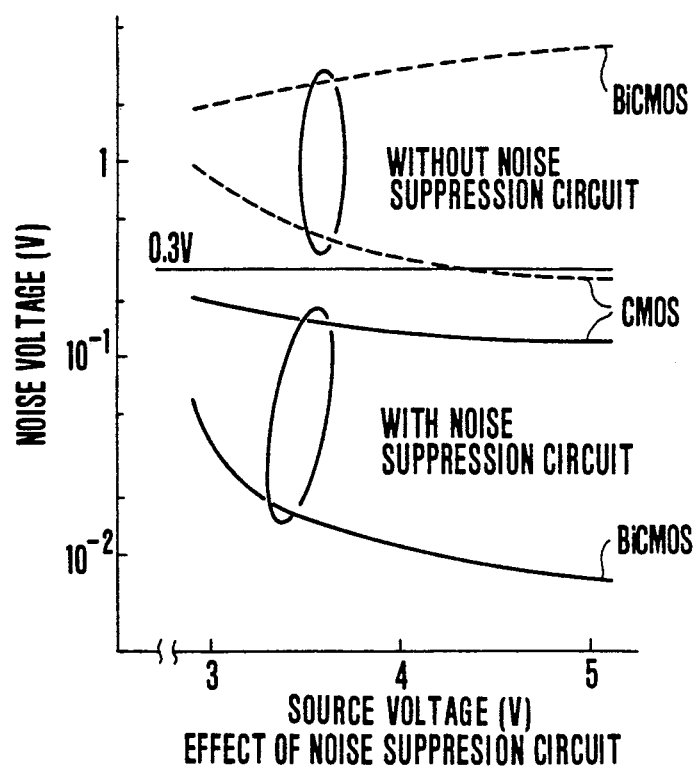
FIGS. 11 and 12 illustrate advantages of the present invention by comparing output noise voltage characteristics and comparing delay characteristics of such circuits with or without the present invention, respectively.
Figure 12:
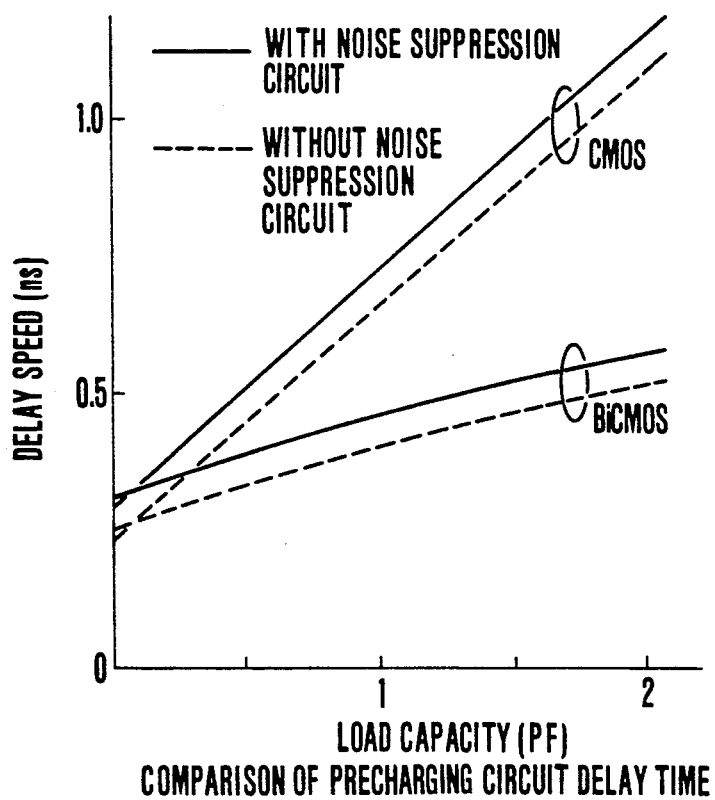

FIGS. 11 and 12 show advantages of the present invention as compared between FIG. 8A in which the output buffer is configured as a BiCMOS inverter and FIG. 10 in which the output buffer is made up of a CMOS inverter. FIG. 11 shows an output noise voltage characteristic depending on whether the measure against alpha ray noise is taken, and shows the voltage characteristic of an output noise of a circuit design fabricated by use of the 0.5 $\mu$m technology. In this diagram, the solid line represents the characteristics accompanied by the measures against alpha rays according to the present invention, and the dotted line those lacking in the measures against alpha ray noise. In the case where no measures are taken against alpha ray noise, the noise voltage of the output node exceeds a tolerable range (with an upper limit at 0.3 V from the threshold voltage of the NMOS FET) for both the cases of BiCMOS and CMOS FETs. Now, suppose the CMOS circuit is formed without the measures against alpha ray noise. With the decrease in the source voltage, the output noise voltage increases. At the source voltage of about 4.5 V, a noise exceeding the threshold voltage of the NMOS FET is generated in the CMOS FET. This may lead to a false operation. In the case of BiCMOS with the source voltage of 4.5 V and by 0.5 $\mu$m technology, the output noise is saturated near a higher level than the tolerable range over the measured source potential range, thus resulting in a considerable increase in the noise voltage. It is seen that an alpha ray soft error is liable to occur in a dynamic logic circuit of 0.5 $\mu$m or less. In the case of the circuit having the measure taken against alpha ray noise according to the present invention, by contrast, the noise voltage is greatly reduced for either of the cases of BiCMOS and CMOS. In particular, the output noise due to alpha ray is reduced to about one hundredth for BiCMOS.

FIG. 12 is a diagram showing the delay time characteristic with and without alpha-ray noise preventive measures as compared between the cases of BiCMOS and CMOS. In this diagram, the solid line indicates the characteristic of a circuit having the feature for preventing alpha ray noise according to the present invention, and the dotted line represents the characteristic of a circuit lacking in such a feature. The use of the BiCMOS inverter increases the speed by 1.5 to 2 times. The increase in delay time by the measure against alpha ray noise according to the present invention is intentionally limited to less than about 10%, and it will be seen that according to the present invention, the soft error margin due to alpha rays can be enlarged without sacrificing the high-speed operation characteristic. FIGS. 11 and 12 correspond to FIGS. 3 and 2 respectively in page 17.7.2 of the paper made public by the present inventors in May 1989 in "SDC CELI-A Novel CMOS/BiCMOS Design Methodology for Mainframe Arithmetic Module Generation" by IEEE 1989 Custom Integrated Circuits Conference, pages 17.7.1 to 17.7.4.

Figure 13:
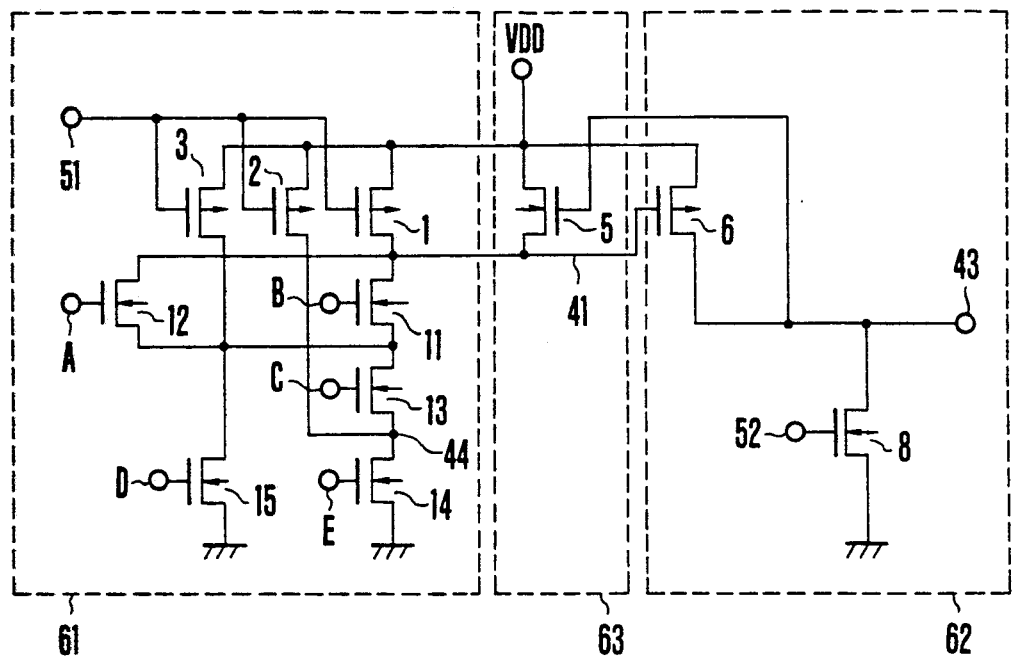
FIG. 13 to 22 are diagrams showing other embodiments of the present invention respectively.

FIG. 13 shows an embodiment of the present invention using a CMOS dynamic inverter for the output buffer. This embodiment comprises an inverter as an output buffer including a PMOS FET 6 with the drain connected to an output node 43, the gate to a logic section output node 41 and the source to VDD and NMOS FET 8 with the drain connected to the output node 43 the gate to a clock signal 52 and the source to the ground, a logic section 61 for precharging the internal nodes of a logic circuit network, and a feedback PMOS 63 for the PMOS FET 5 with the drain connected to the logic section output node 41, the gate to the output node 43 and the source to VDD. In the precharging operation, the clock signal 51 is set to a low level and the clock signal 52 to a high level, with the node 41 and the internal nodes of the logic circuit network charged to high level. As a result, the PMOS FET 6 turns off. Since the NMOS FET 8 is on, the output node 43 turns to low level. Also, the PMOS FET 5 is turned on. When the clock signal 51 is turned to high level and the clock signal 52 to low level, the PMOS FETs 1 to 3 and the NMOS FET 8 turn off to enter the computation process. Upon current conduction between the logic section output node 41 and the ground by input signals A to E, the potential of the node 41 drops. In a short time, the PMOS FET 6 turns on, and the output node 43 increases in potential to high level. The PMOS FET 5, on the other hand, is turned off. The effect of precharging the internal nodes of the logic circuit network and latching the logic section output node by the feedback PMOS is identical to that for the aforementioned embodiment. As compared with the case using a CMOS static inverter for the output buffer in FIG. 10, the floating condition (high-impedance state) caused during the computation process when the output node 43 is at low level reduces the noise margin. Nevertheless, since the NMOS FET 8 turns off as soon as the computation is started, both the PMOS FET 6 and the NMOS FET 7 turn on simultaneously during the transient state of the output node 43 from low to high level in FIG. 10, so that the PMOS FET 6 injects electric charges into the output node 43. As compared with the case using a CMOS static inverter for extracting charges by the NMOS FET 7 at the same time, however, the high delay speed of the inverter permits a high-speed computation. Also, the switching of the inverter of the output buffer consumes less power.

Figure 14:
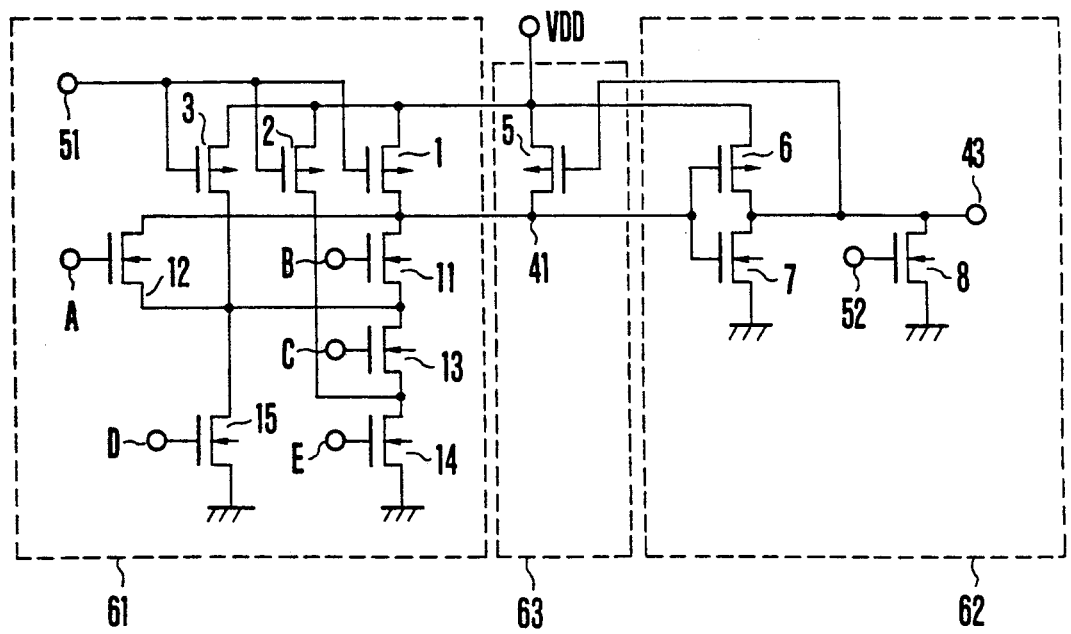

FIG. 14 shows a circuit making the most of the advantages of the both the CMOS static inverter and the CMOS dynamic inverter. This circuit comprises an output buffer 62 as an inverter including a PMOS FET 6 with the drain connected to an output node 43, the gate to a logic section output node 41, and the source to VDD, an NMOS FET 7 with the drain connected to the output node 43, the gate to the logic section output node 41 and the source to the ground, and an NMOS FET 8 with the drain connected to the output node 43, the gate to a clock signal 52 and the source to the ground, a logic section 61 for precharging the internal nodes of a logic circuit network, and a feedback PMOS 63 for the PMOS FET 5 with the drain connected to the logic section output node 41, the gate to the output node 43 and the source to the VDD. As compared with the embodiment of FIG. 13, the embodiment shown in FIG. 14 having the NMOS FET 7 prevents the output node 43 from floating during the computation process, thereby enlarging the noise margin. The driving force of the NMOS FET 7 is set to a small value, because if it is set to a high level, the delay speed of the output buffer would also increase undesirably. Even if the PMOS FET 6 and the NMOS FET 7 turn on at the same time in the transient state of the output node 43 from low to high level, the weak force with which the NMOS FET 7 extracts electric charges from the output node 43 keeps the delay speed of the inverter substantially the same as in the embodiment of FIG. 13. The extraction of electric charges from the output node 43 for the precharging operation is effected primarily by the NMOS FET 8. The input of the clock signal and the circuit operation for the precharging and computation processes are similar to those of the embodiments shown in FIGS. 12 and 13. Also, the effect of precharging the internal nodes of the logic circuit network and latching the logic section output node by the feedback PMOS is the same as that of the aforementioned embodiments.

Figure 15:
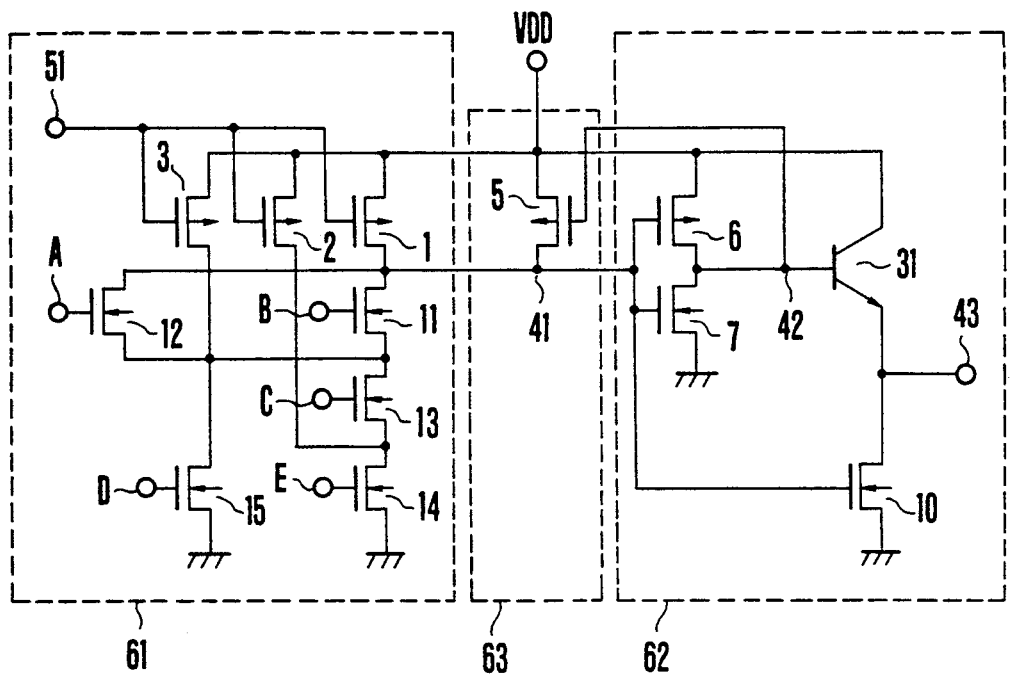

FIG. 15 shows another embodiment using a BiCMOS static inverter for the output buffer. This embodiment comprises an output buffer 62 as an inverter including a PMOS FET 6 with the drain connected to a node 42, the gate to a logic section output node 41 and the source to VDD, an NMOS FET 7 with the drain connected to the node 42, the gate to the logic section output node 41 and the source to the ground, a bipolar transistor 31 with the base connected to the node 42, the collector to the VDD and the emitter to the output node 43, an NMOS FET 10 with the drain connected to the output node 43, the gate to the logic section output node 41 and the source to the ground, a logic section 61 for precharging the internal nodes of the logic circuit network, and a feedback PMOS 63 for the PMOS FET 5 with the drain connected to the logic section output node 41, the gate to the node 42 and the source to the VDD. In precharging operation, a clock signal 51 is set to low level, and the logic section output node 41 and the internal nodes of the logic circuit network charged to high level. As a consequence, the PMOS FET 6 turns off, the NMOS FET 7 turns on with the potential of the node 42 turned to low level. The bipolar transistor 31 turns off, and the NMOS FET 10 turns on, so that the output node 43 is turned to low level. The computation is started when the clock signal 51 is turned to high level. When current conduction begins between the node 41 and the ground by the input signals A to E, the electric charges stored in the node 41 are released to decrease the potential thereof. The PMOS FET 6 is thus turned on and the NMOS FETs 7 and 10 turned off. The node 42 is charged by the PMOS FET 6, and in short time, the PMOS FET 5 is turned off, with the bipolar transistor 31 turned on, thus charging the output node 43 at high speed to end the computation process. In view of the fact that the output is driven by a bipolar transistor, a high-speed computation is available even under a heavy load. The effect of precharging the internal nodes of the logic circuit network and latching the logic section output node by the feedback PMOS is the same as in the aforementioned embodiments.

Figure 16:
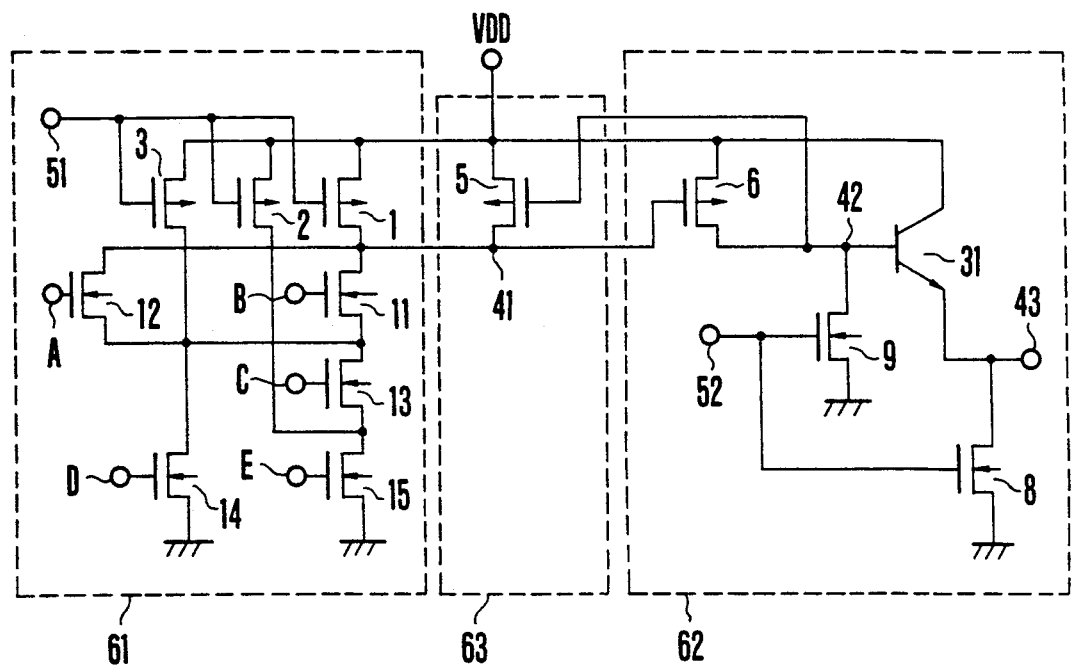

FIG. 16 shows another embodiment in which a bipolar transistor connected to an output node is driven by a CMOS dynamic inverter. This embodiment comprises an output buffer 62 as an inverter including a PMOS FET 6 with the drain connected to a node 42, the gate to a logic section output node 41 and the source to a VDD, an NMOS FET 9 with the drain connected to the node 42, the gate to a clock signal 52 and the source to the ground, a bipolar transistor 31 with the base connected to the node 42, the collector to the VDD and the emitter to the output node 43, and an NMOS FET 8 with the drain connected to the output node 43, the gate to the clock signal 52 and the source to the ground, a logic section 61 for precharging the internal nodes of the logic circuit network, and a feedback PMOS 63 for the PMOS FET 5 with the drain connected to the logic section output node 41, the gate to the node 42 and the source to the VDD. As in the embodiment using a CMOS dynamic inverter for the output buffer, the noise margin is reduced. It is possible, however, to drive the bipolar transistor at high speed. The effect of precharging the internal nodes of the logic circuit network and latching the logic section output node by the feedback PMOS is the same as in the aforementioned embodiments.

Figure 17:
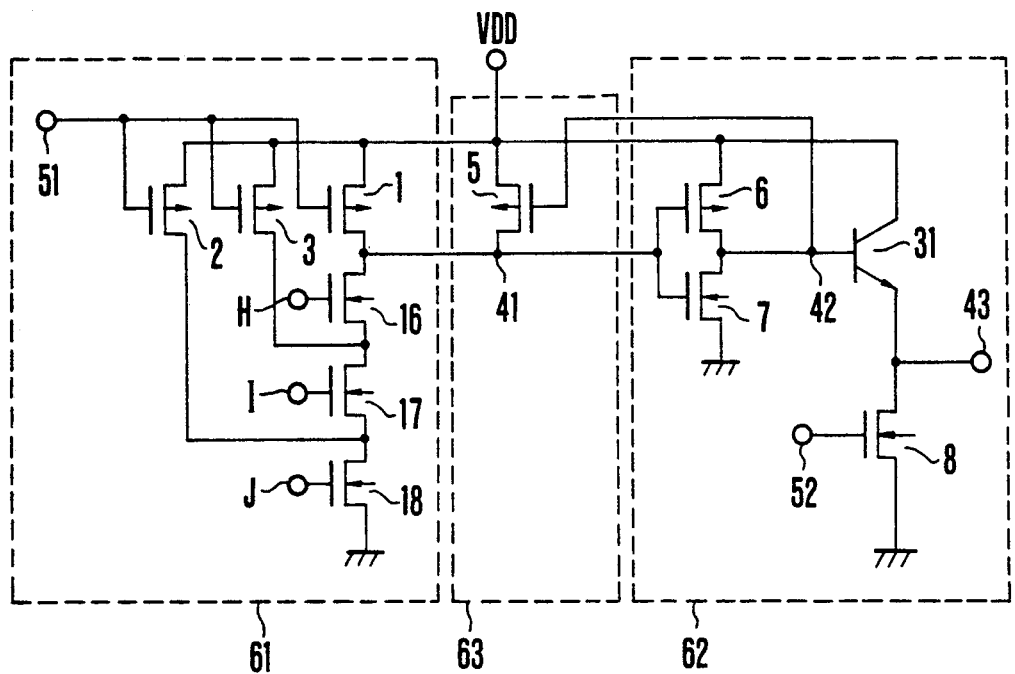
Figure 18:
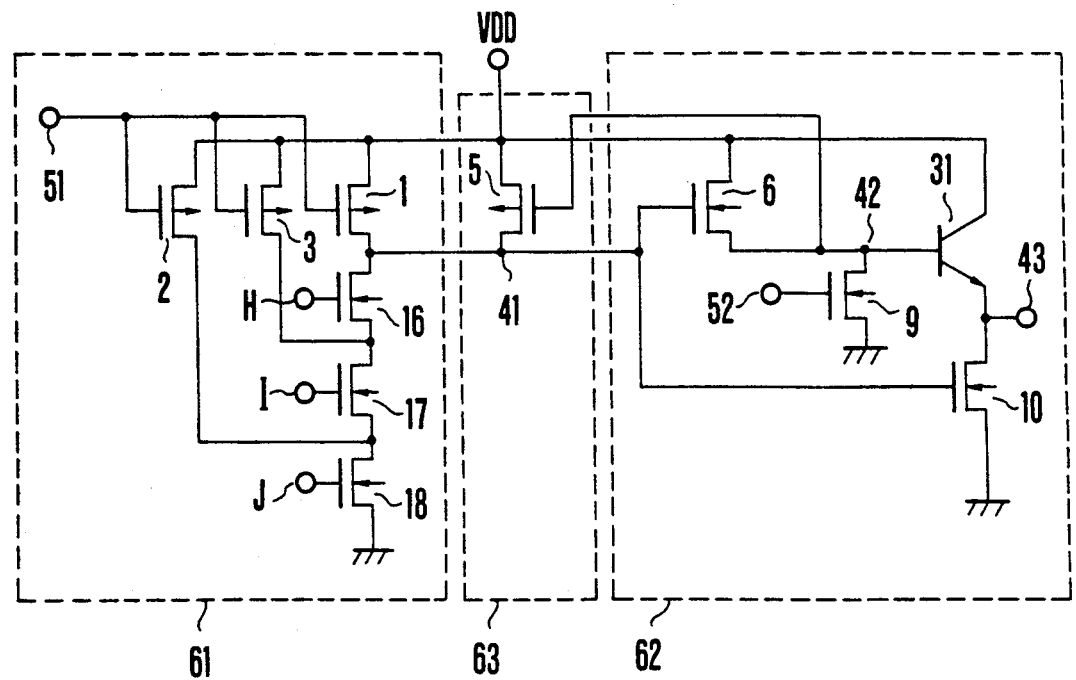

FIGS. 17 and 18 show other embodiments of the present invention. In both cases, the logic computation of (H·I·J) is executed for input signals H to J. In FIG. 17, numerals 16, 17 and 18 designate NMOS FETs, and characters H to J data signal input terminals. The circuit of FIG. 17 comprises an output buffer 62 as an inverter including a PMOS FET 6 with the drain connected to a node 42, the gate to a logic section output node 41 and the source to a VDD, an NMOS FET 7 with the drain connected to the node 42, the gate to the logic section output node 41 and the source to the ground, a bipolar transistor 31 with the base connected to the node 42, the collector to the VDD and the emitter to an output node 43, and an NMOS FET 8 with the drain connected to the output node 43, the gate to a clock signal 52 and the source to the ground, a logic section 61 for precharging the internal nodes of the logic circuit network, and a feedback PMOS 63 for the PMOS FET 5 with the drain connected to the logic section output node 41, the gate to the node 42 and the source to the VDD. When the clock signal 51 is set to low level and the clock signal 52 to high level, the precharging operation is executed. The PMOS FETs 1, 2 and 3 are turned on, and if the input signals H to J are at low level, the logic section output node and the internal nodes of the logic circuit network are turned to high level. As a result, the PMOS FET 6 turns off and the NMOS FET 7 turns on, so that the node 42 is turned to low level. The PMOS FET 5 turns on and the bipolar transistor 31 turns off. Since the NMOS FET 8 is on, the output node 43 is turned to low level. Subsequently, the computation process is started with the clock signal 51 at high level and the clock signal 52 at low level. When the input signals H to J are at high level, current conduction starts between the node 41 and the ground, thereby reducing the potential of the node 41. The PMOS FET 6 turns on the NMOS FET 7 turns off, so that the potential at the node 42 increases. In short time, the bipolar transistor turns on with the PMOS FET 5 turned off. The output node 43 is turned to high level by the bipolar transistor 31 thereby to terminate the computation process. The effect of precharging the internal nodes of the logic circuit network and latching the logic section output by the feedback PMOS is the same as that in the above-mentioned embodiments.

The circuit shown in FIG. 18 comprises an output buffer 62 as an inverter including a PMOS FET 6 with the drain connected to a node 42, the gate to a logic section output node 41 and the source to a VDD, an NMOS FET 9 with the drain connected to the node 42, the gate to a clock signal 52 and the source to the ground. A bipolar transistor 31 has the base connected to the node 42, with the collector connected to the VDD and the emitter to the output node 43, and an NMOS FET 10 with the drain connected to the output node 43, the gate to the logic section output node 41 and the source to the ground, a logic section 61 for precharging the internal nodes of the logic circuit network, and a feedback PMOS section 63 for the PMOS FET 5 with the drain connected to the logic section output node 41, the gate to the node 42 and the source to the VDD. When the clock signal is set to low level and the clock signal 52 to high level, the precharging operation is started. The PMOS FETs 1, 2 and 3 turn on, and if the input signals H to J are at low level, the logic section output node and the internal nodes of the logic circuit network turn to high level. As a result, the PMOS FET 6 turns off. Also, since the NMOS FET 9 is on, the node 42 turns to low level, with the PMOS FET 5 turned on and the bipolar transistor 31 off. Since the NMOS FET 10 is on, on the other hand, the output node 43 becomes low in level. After that, the computation operation is started with the clock signal turned to high level and the clock signal 52 to low level. When the input signals H to J are at high level, the current conduction begins between the node 41 and the ground, and the node 41 drops in potential. As a result, the PMOS FET 6 is turned on and the NMOS FET 10 off. Since the NMOS FET 9 is off, the potential of the node 42 increases, and soon after, the bipolar transistor 31 is turned on while turning off the PMOS FET 5. The output node 43 is turned to high level by the bipolar transistor 31 thereby to end the computation process. The effect of precharging the internal nodes of the logic circuit network and latching the logic section output node by the feedback PMOS is the same as in the aforementioned embodiments.

Figure 19:
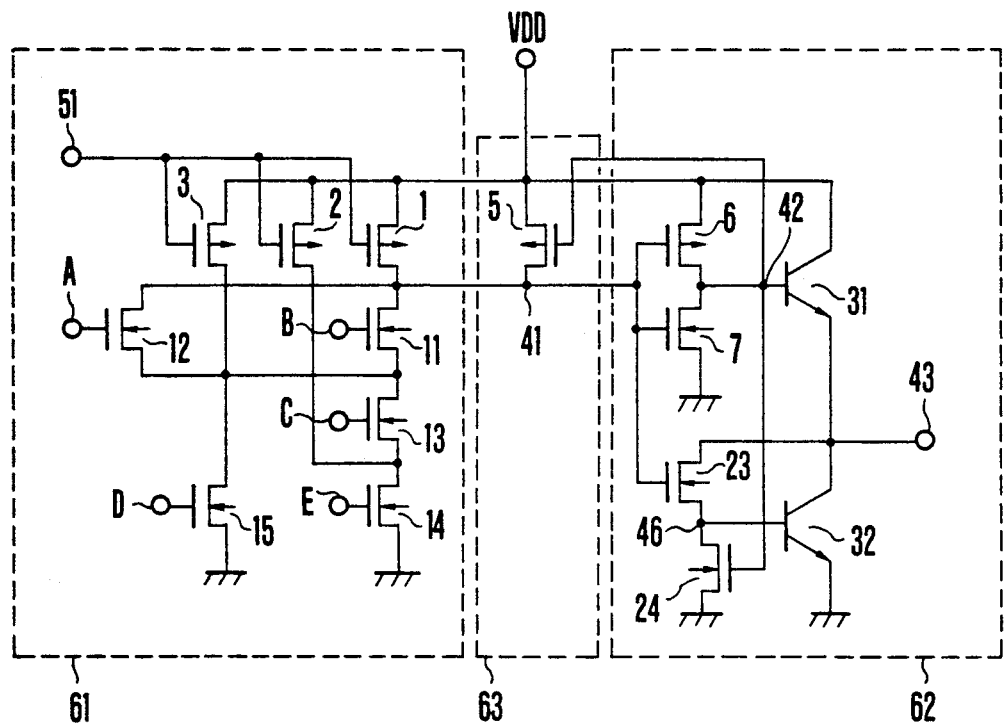

FIG. 19 shows an embodiment using a BiCMOS circuit including a bipolar transistor for extracting electric charges to the ground of the output node. Numerals 23 and 24 designate NMOS FETs, numeral 32 an NPN-type bipolar transistor, and numerals 42, 46 internal nodes of an output buffer 62. This circuit comprises an output buffer 62 as an inverter including a PMOS FET 6 with the drain thereof connected to the node 42, the gate to the logic section output node 41 and the source to the VDD, an NMOS FET 7 with the drain connected to the node 42, the gate to the logic section output node 42 and the gate to the logic section output node 41, and the source to the ground, a bipolar transistor 31 with the base connected to the node 42, the collector to the VDD and the emitter to the output node 43, an NMOS FET 24 with the drain connected to the node 43, the gate to the node 46 and the source to the ground, a bipolar transistor 32 with the base connected to the node 46, the collector to the output node 43 and the emitter to the ground, a logic section 61 for precharging the internal nodes of the logic circuit network, and a feedback PMOS section 63 for the PMOS FET 5 with the drain connected to the logic section output node 41, the gate to the node 42 and the source to the VDD. In precharging operation the clock signal 51 is turned to low level and the bipolar transistor 31 turned off. Also, since the NMOS FET 23 and is turned on and the NMOS FET 24 off, the output node 43 is turned to low level by the bipolar transistor 32. On the other hand, the PMOS FET 5 is turned on. When the clock signal 51 is turned to high level, the computation process is started. When conduction begins between the node 41 and the ground by the input signals A to E, the electric charges so far stored in the node 41 are released to decrease the potential thereof. As a result, the PMOS FET 6 is turned on and the NMOS FET 7 turned off, so that the potential at the node 42 increases to turn on the bipolar transistor 31. The NMOS FET 23 turns off and the NMOS FET 24 turns on, with the result that the node 46 is turned to low level, thus turning off the bipolar transistor 32. As a result, the output node 43 is charged to high level. The effect obtained in precharging the internal nodes of the logic circuit network and latching the logic output node by the feedback PMOS is similar to that in the aforementioned embodiments.

Figure 20:
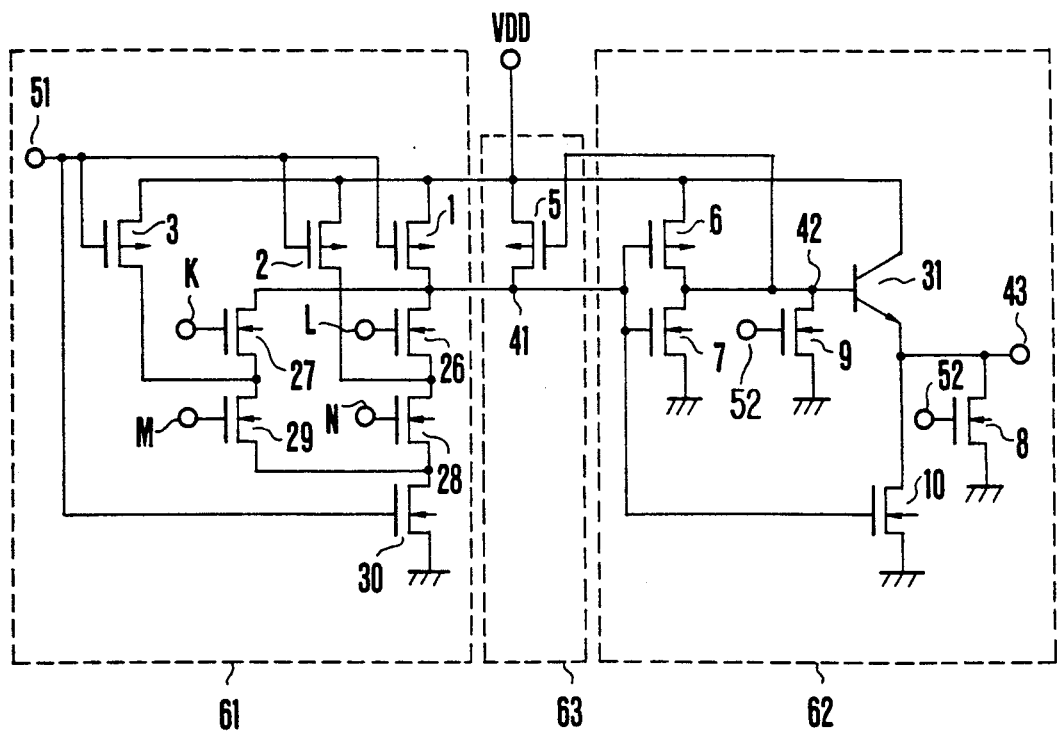

Explanation will now be made about the embodiment shown in FIG. 20. In FIG. 20, numerals 26 to 30 designate NMOS FETs, and characters K to N data signal input terminals. The electric charges stored in the node 41 during the computation process are released always through the NMOS FET 30. This embodiment is effective applied to the case in which the whole or part of the input signals K to N fails to turn to low level during the precharging operation or the clock input signal 51 is applied after the input signals K to N. When the clock input signal 51 is turned to low level and the clock signal 52 to high level, the precharging operation is initiated. In the process, the NMOS FET 30 is turned off, and therefore there takes place no current conduction between the node 41 and the ground even if the input signals K to N are secured to low level, so that the charges stored by the PMOS FETs 1, 2 and 3 are not discharged to the ground. Thus the node 41 is maintained at high level. This circuit is thus effectively used as a dynamic logic circuit supplied with an input signal from the output of a static circuit or the like incapable of securing the output at low level under initial conditions. When the clock input signal 51 is turned to low level and the clock signal 52 to high level after an input signal is determined, the computation process is started. Also, the inverter of the output buffer may be used in the same form of that used in the aforementioned embodiments depending on the object of a circuit involved. The behaviour of the output buffer and the latch means during the computation process is the same as in the aforementioned embodiments. The effect obtained in precharging the internal nodes of the logic circuit network and latching the logic section output node by the feedback PMOS is also the same as that obtained in the aforementioned embodiments.

Figure 21:
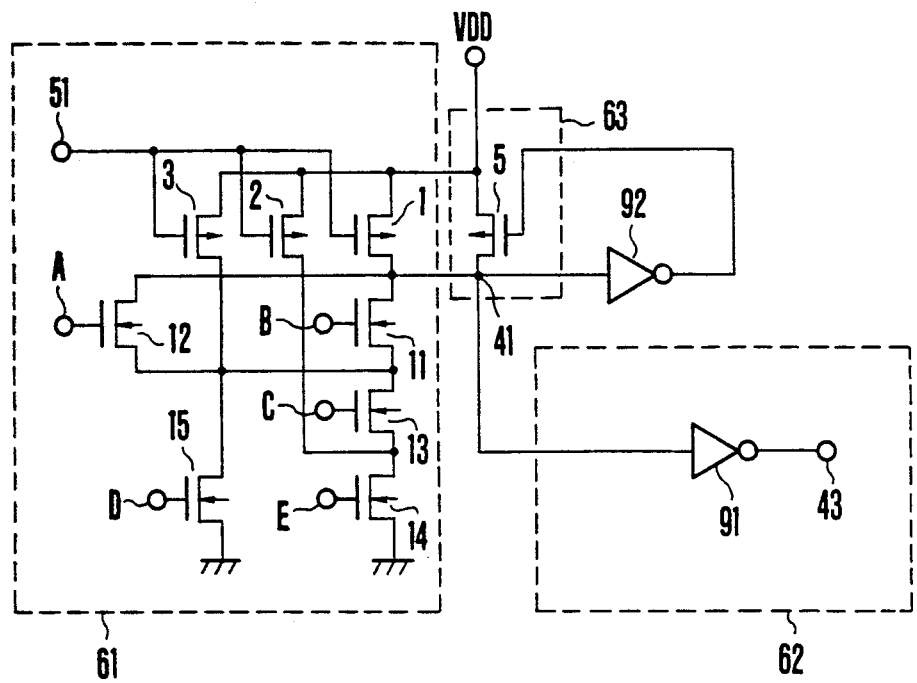

The circuit of FIG. 21 comprises a logic circuit 61 for precharging the internal nodes of the logic circuit network, a PMOS FET 5 for latching the logic section output node to high level, an inverter 92 for driving the PMOS FET 5, and an output buffer 62 for applying the result of computation to the output node 43. In FIG. 21, numerals 91 and 92 designate an inverter. The precharging operation is performed in this embodiment in the same way as in the above-mentioned embodiments. In the computation process, when current conduction takes place between the logic section output node 41 and the ground by input signals A to E, the potential at the node 41 drops with the output of the inverter 92 turned to high level. Since the load of the inverter 92 is made up only of the PMOS FET 5, however, the PMOS FET 5 is turned off at high speed. As a result, the node 41 drops in potential at high speed, and the output buffer 91 is also charged to high level very quickly. The inverter 92 and the output buffer 62 may take various forms used in the CMOS or BiCMOS circuit in accordance with the object involved. The effect obtained in precharging the internal nodes of the logic circuit network and latching the logic section output node by the feedback PMOS is the same as that obtained in the aforementioned embodiments.

Figure 22:
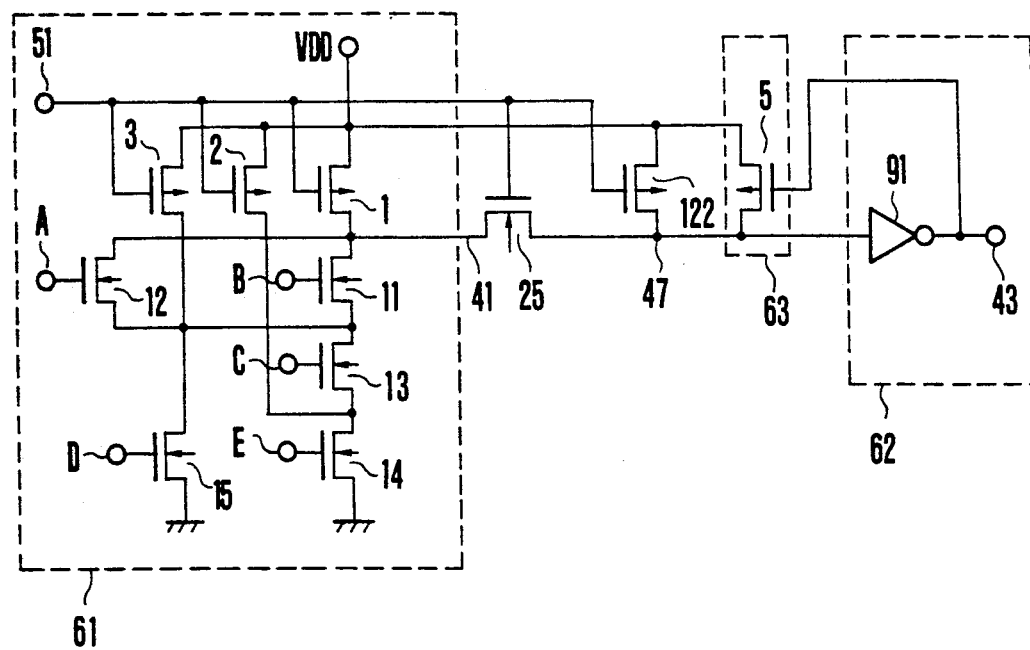

Now, the embodiment shown in FIG. 22 will be explained. In FIG. 22, numeral 25 designates an NMOS FET, and numeral 122 a PMOS FET. This circuit comprises a logic section 61 for precharging the internal nodes of a logic circuit network, an output buffer 62 supplied with a signal from the node 47 for applying a logic inversion of the node 47 to the output node 43, and an NMOS FET 25 inserted between the logic section output node 41 and the input node 47 of the output buffer 62 and turned on when the clock signal 51 is at high level, a PMOS FET 122 with the drain connected to the node 47, the gate to the clock signal 51 and the source to the VDD, and a PMOS FET 5 with the drain connected to the node 47, the gate to the output node 43 and the source to the VDD. When the clock signal 51 is turned to low level, the NMOS FET 25 turns off and current conduction stops between the node 41 and the node 47. As a result, even when the logic section output node 41 is not turned to high level, the node 47 is turned to high level by the PMOS FET 122 with the output node 43 turned to low level. Also, the PMOS FET 5 is turned on. With the start of a precharging operation, therefore, the output node may be turned to low level even if the input signals A to E are not at low level. The computation process is carried out when the clock signal 51 is turned to high level. In the process, the NMOS FET 25 is turned on, and therefore if conduction takes place between the node 41 and the ground by the input signals A to E, the electric charges in the node 47 are also released, and the same node drops in potential. The inverter 91 of the output buffer turns the output node 43 to high level, thus completing the computation process. The effect produced in precharging the internal nodes of the logic circuit network and latching the logic section output node by a feedback PMOS is the same as that in the aforementioned embodiments. The use of the embodiment under consideration permits a high-speed precharging operation even when a precharging circuit is connected in series in multiple stages. The inverter 91 of the output buffer may take various forms depending on the object involved. If BiCMOS inverter circuit is connected to the feedback PMOS as shown in the embodiments of FIGS. 15 to 19, a BiCMOS dynamic circuit may be used for embodying the invention.

It will thus be understood from the foregoing description that according to the present invention, the soft error margin is enlarged with an increased operational speed. The present invention is thus applicable also to the arithmetic and logic circuit of the ALU disclosed in U.S. patent application Ser. No. 279034 entitled "Semiconductor Integrated Circuit Device" filed on Dec. 2, 1988 in the name of Doi et al. and assigned to the same assignee as the present invention.

In place of the NMOS FET making up the logic section 61 in the aforementioned embodiments, a PMOS FET may be used with equal effect, in which case the present invention is applicable with the conduction type and the polarity of the input signals of the bipolar transistor reversed.

According to the present invention, the required noise margin is secured, and especially, the margin against the soft error is enlarged without adversely affecting the high-speed characteristics of a dynamic logic circuit reduced in size for operation with a low-voltage power source of 4.5 V or less by the 0.5-$\mu$m-rule technology.

We claim:

1. A dynamic semiconductor logic circuit comprising:

MOS FET logic means having a high-speed operation characteristic including MOS transistors with internal nodes for connecting respective ones of said MOS transistors with one another and with an output node, said logic means being adapted to undergo a precharging operation to said output node and said internal nodes responsive to a clock signal and to effect a logic operation with the precharged nodes and output a result of the logic operation through the output node in response to logical input signals; and means for preventing wrong operations in the precharging operation without sacrificing the high-speed operation characteristic of the logic means, wherein said preventing means includes first precharging means for precharging the output node to a power source potential and second precharging means for precharging said internal nodes to said source potential, respectively, in order to prevent wrong operations which otherwise may be generated by charge sharing of said internal nodes, and further including third means for latching said output node at said source potential after the precharging in order to prevent potential variations of said output node due to soft error noise which otherwise may be generated by a possible alpha ray incident upon said logic means.

2. A circuit according to claim 1 wherein said latching means has a predetermined maximum current value which is set based only on preventing potential variations of said output node caused by said soft error noise.

3. A circuit according to claim 1 wherein said power source potential is 4.5 volts or less.

4. A dynamic semiconductor logic circuit comprising:

MOS FET logic means having a high-speed operation characteristic including MOS transistors with internal nodes for connecting respective ones of said MOS transistors with one another and with an output node, said logic means being adapted to effect a logic operation in response to logical input signals after effecting a precharging operation to said output node and said internal nodes responsive to an input clock signal;

output buffer means for outputting a result of the logic operation; and precharging means for precharging the output node and the internal nodes of the logic means in response to the input clock signal, said precharging means having soft error noise suppression means latching the output node at a power source potential after the precharging operation in order to enlarge a soft error margin of the logic means without sacrificing the high-speed operation characteristic thereof, wherein said precharging means includes, for the mode of the precharging operation, first means for precharging the output node of the logic means to the power source potential in response to the input clock signal, second means for precharging the internal nodes of the logic means in response to the clock signal, and feedback means forming said soft error noise suppression means for latching the output node of the logic means to the power source potential under control of an output signal of the output buffer means, said feedback means limiting its latching current to less than a predetermined current value in comparison with a current value extracted from the output node by the FET logic means during the mode of logic operation.

5. A circuit according to claim 4 wherein said predetermined current value is set based only on preventing potential variations of said output node caused by soft error noise.

6. A circuit according to claim 4 wherein said power source potential is 4.5 volts or less.

7. A circuit according to claim 4, wherein said logic means includes a logic circuit network comprising a plurality of MOS FETs of a first conductivity type and connected between the logic means output node and a first power source terminal, thereby defining a discharge path of the output node in response to at least two of the input signals, wherein junction points of the plurality of MOS FETs define the internal nodes of the logic means.

8. A circuit according to claim 7, wherein said first means includes a MOS FET of a second conductivity type having a drain connected to the logic means output node, a gate receiving the clock signal, and a source connected to a second power source terminal, and said second means includes at least one MOS FET of the second conductivity type having a drain connected to at least one of the internal nodes, a gate receiving the clock signal and a source connected to the second power source terminal.

9. A circuit according to claim 8, wherein said feedback means includes a MOS FET of second conductivity type having a drain connected to the logic means output node, a gate receiving an output from the output buffer means, and a source connected to the second power source terminal.

10. A circuit according to claim 9, wherein said output buffer means includes an inverter connected to the logic means output node to receive an output therefrom and produce a logically inverted output signal.

11. A circuit according to claim 10, wherein said inverter is a CMOS static inverter.

12. A circuit according to claim 10, wherein said inverter is a CMOS dynamic inverter.

13. A circuit according to claim 10, wherein said output buffer means includes a bipolar transistor having a base for receiving the output signal of said inverter and emitter coupled to provide an output for the bipolar transistor.

14. A circuit according to claim 13, wherein said output buffer means includes MOS FET of a first conductivity type having a drain connected to the emitter of said bipolar transistor, a gate connected to the logic means output node and a source connected to the first power source terminal.

15. A circuit according to claim 13, wherein said output buffer means includes MOS FET of a first conductivity type having a drain connected to the base of said bipolar transistor, a source to the first power source terminal and a gate for receiving a second clock signal.

16. A circuit according to claim 13, wherein said output buffer means includes MOS FET of a first conductivity type having a drain connected to the emitter of said bipolar transistor, a source connected to said first power source terminal, and a gate for receiving a second clock signal.

17. A dynamic MOS FET logic circuit comprising:

logic circuit means including a plurality of first conductivity type MOS transistors having input terminals for receiving input signals for a logical operation, an output node and internal nodes connecting therethrough said transistors to each other for permitting precharging output node and said internal nodes in order to discharge the precharged nodes to a first potential source to produce a corresponding logical output signal through said output node in response to the received input signals;

precharging means comprising MOS transistors connected between a second potential source and said input and output nodes and having clock input terminals for receiving a first clock signal to precharge said output node and said internal nodes in response thereto;

output buffer means having a circuit output terminal and connected to said output node of said logic circuit means for producing a logical-inversion signal of said logical output signal; and a feedback MOS transistor connected between said second source terminal and said output node of said logic circuit means for feeding said output node according to said logical-inversion signal in order to compensate voltage changes of said logical output signal at said output node, said voltage changes being possibly caused due to $\alpha$ particles being occasionally incident upon said logic circuit means.

18. A circuit according to claim 17 wherein said second potential source is 4.5 volts or less.

19. A circuit according to claim 17 wherein said feedback MOS transistor has a predetermined maximum current capability which is set based only on preventing said voltage changes of said logical output signal at said output node caused by said particles.

20. A circuit according to claim 19 wherein said feedback MOS transistor has said predetermined maximum current capability is set by limiting gate width of said feedback MOS transistor to a predetermined maximum value.

21. A circuit according to claim 19 wherein said ratio between the maximum current capability of the feedback MOS transistor and a current value extracted from the output node by the logic circuit means during the mode of logic operation is set to 0.6 or less.

22. A dynamic MOS FET logic circuit comprising:

logic circuit means including a plurality of first conductivity type MOS transistors having input terminals for receiving input signals for a logical operation, an output node and internal nodes connecting therethrough said transistors to each other to permit precharging said output node and said internal nodes in order to discharge the precharged nodes to a first potential source to produce a corresponding logical output signal through said output node in response to the received input signals;

precharging means comprising MOS transistors connected between a second potential source and said input and output nodes and having clock input terminals for receiving a first clock signal to precharge said output node and said internal nodes in response thereto;

output buffer means having a circuit output terminal and connected to said output node of said logic circuit means for producing a logical-inversion signal of said logical output signal, wherein said buffer means comprises CMOS transistors means connected between said first and second potential sources and having gates connected to said output node of said logic circuit means, and drains connected to a common node, and wherein said buffer further comprises a bipolar transistor having a base connected to said common node, a collector connected to said second potential source, and an emitter connected to said circuit output terminal of said buffer means; and MOS transistor means for disabling and enabling said logical-inversion signal in response to the charging and the discharging operation to said output node and said internal nodes of said logic circuit means, respectively, wherein said logic circuit further comprises a second conductivity type MOS feedback transistor having a gate connected to said base of said bipolar transistor, a drain connected to said output node of said logic circuit means, and a source connected to said second potential source, whereby said feedback transistor is adapted to electrically feed said output node under control of said logical-inversion signal in order to compensate voltage changes of said logical output signal at said output node, said voltage changes being possibly caused due to α particles being occasionally incident upon said logic circuit means.

23. A circuit according to claim 22 wherein said second potential source is 4.5 volts or less.

24. A circuit according to claim 22, wherein said MOS transistor means includes a first conductivity type first MOS transistor having a gate connected to said output node, a drain connected to said emitter, and a source connected to said first potential source.

25. A circuit according to claim 24, wherein said MOS transistor means includes a first conductivity type third MOS transistor having a gate connected to a second clock terminal for receiving a second clock signal opposite in phase to said first clock signal, a drain connected to said emitter, and a source connected to said first potential source, and further includes a first conductivity type fourth MOS transistor having a gate connected to said second clock terminal, a drain connected to said drain connected common node of said CMOS means, and a source connected to said first potential source.

26. A circuit according to claim 22, wherein said MOS transistor means includes a first conductivity type second MOS transistor having a gate connected to a second clock terminal for receiving a second clock signal of opposite phase to said first clock signal, a drain connected to said emitter, and a source connected to said first potential source.

27. A circuit according to claim 22, wherein said MOS transistor means comprises a first conductivity type first transistor and a second conductivity type second transistor, said buffer means further including an NPN bipolar transistor, wherein said first transistor has a gate connected to said output node, a drain connected to said emitter, and a source connected to a drain of said second MOS transistor having a source connected to said first potential source, and wherein said NPN bipolar transistor has a base connected to said source of said first MOS transistor and to said drain of said second MOS transistor, and a collector connected to said emitter of said bipolar transistor, and an emitter connected to said first potential source.

28. A circuit according to claim 22 wherein said feedback MOS transistor has a predetermined maximum current capability which is set based only on preventing said voltage changes of said logical output signal at said output node caused by said particles.

29. A circuit according to claim 28 wherein said feedback MOS transistor has said predetermined maximum current capability is set by limiting a gate width of said feedback MOS transistor to a predetermined maximum value.

30. A circuit according to claim 28 wherein said ratio between the maximum current capability of the feedback MOS transistor and a current value extracted from the output node by the logic circuit means during the mode of logic operation is set.

31. A dynamic MOS FET logic circuit comprising:
logic circuit means including a plurality of first conductivity type MOS transistors having input terminals for receiving input signals for a logical operation, an output node and internal nodes connecting therethrough said transistors to each other to permit precharging said output node and said internal nodes to discharge the precharged nodes to a first potential source to produce a corresponding logical output signal through said output node in response to the received input signals;

precharging means comprising MOS transistors connected between a second potential source and said input and output nodes and having clock input terminals for receiving a first clock signal to precharge said output node and said internal nodes in response thereto;

output buffer means having a circuit output terminal connected to said output node of said logic circuit means for producing a logical-inversion signal of said logical output signal, wherein said buffer means comprises a second conductivity type first MOS transistor and a bipolar transistor, said first MOS transistor having a gate connected to said output node, a source connected to said second potential source, and a drain connected to a base of said bipolar transistor having an emitter connected to said circuit output terminal, and wherein said buffer means further comprise MOS transistor means including a first conductivity type second MOS transistor having a drain connected to said base, a source connected to said first potential source, and a gate connected to a second clock terminal for receiving a second clock signal opposite in phase to said first clock signal, wherein said MOS transistor means is adapted to disable and enable said logical-inversion signal in response to the charging and the discharging operation to said nodes of said logic circuit, respectively; and said logic circuit further comprising a second conductivity type MOS feedback transistor having a gate connected to said base of said bipolar transistor of said buffer means, a source connected to said second potential source, and a drain connected to said output node, whereby said feedback transistor is adapted to electrically feed said output node under control of said logical-inversion signal in order to compensate voltage changes of said logical output signal at said output node being possibly caused due to α particles occasionally incident upon said logic circuit means.

32. A circuit according to claim 31, wherein said MOS transistor means includes a first conductivity type third MOS transistor having a gate connected to said second clock terminal, a drain connected to said emitted, and a source connected to said first potential source.

33. A circuit according to claim 31, wherein said MOS transistor means includes a first conductivity type MOS transistor having a gate connected to said output node, a drain connected to said emitter, and a source connected to said first potential source.

34. A circuit according to claim 31 wherein said second potential source is 4.5 volts or less.

35. A circuit according to claim 31 wherein said feedback MOS transistor has a predetermined maximum current capability which is set based only on preventing said voltage changes of said logical output signal at said output node caused by said particles.

36. A circuit according to claim 35 wherein said feedback MOS transistor has said predetermined maximum current capability is set by limiting a gate width of said feedback MOS transistor to a predetermined maximum value.

37. A circuit according to claim 35 wherein said ratio between the maximum current capability of the feedback MOS transistor and a current value extracted from the output node by the logic circuit means during the mode of logic operation is set to 0.6 or less.

38. An α-particle noise suppression type dynamic MOS FET logic circuit comprising:

logic circuit means including a plurality of first conductivity type MOS transistors having input terminals for receiving input signals for a logical operation, an output node and internal nodes connecting therethrough said transistors to each other to permit precharging of said output node and said internal nodes in order to discharge the precharged nodes to a first potential source to produce a corresponding logical output signal through said output node in response to the received input signals;

precharging means comprising MOS transistors connected between a second potential source and said input and output nodes and having clock input terminals for receiving a first clock signal to precharge said output node and said internal nodes in response thereto;

output buffer means having a circuit output terminal connected to said output node of said logic circuit means for producing a logical-inversion signal of said logical output signal, wherein said buffer means comprises first conductivity type first MOS transistor and second conductivity type second MOS transistor having their gates connected to said output node, and their drains connected by a common node to each other, said first MOS transistor having a source connected to said first potential source, said second MOS transistor having a source connected to said second potential source;

a bipolar transistor having a gate connected to the drain connected common node of said first and second MOS transistors, a collector connected to said second potential source, and an emitter connected to said circuit output terminal of said buffer means;

a first conductivity type second MOS transistor having a gate connected to said output node, a drain connected to said emitter, and a source connected to said first potential source;

a first conductivity type third MOS transistor having a gate connected to a second clock terminal for receiving a second clock signal of opposite phase to said first clock signal, a drain connected to said emitter, and source connected to said first potential source; and a first conductivity type fourth MOS transistor having a gate connected to said second clock terminal, a drain connected to said drain connected common node of said first and second MOS transistors, and a source connected to said first potential source;

wherein said logic circuit further comprises a second conductivity type MOS feedback transistor having a gate connected to said base of said bipolar transistor of said buffer means, a source connected to said second potential source, and a drain connected to said output node, whereby said feedback transistor is adapted to electrically feed said output node under control of said logical-inversion signal in order to compensate voltage changes of said logical output signal at said output node being possibly caused due to α particles occasionally incident upon said logic circuit means.

39. A circuit according to claim 38 wherein said feedback MOS transistor has a predetermined maximum current capability which is set based only on preventing said voltage changes of said logical output signal at said output node caused by said α particles.

40. A circuit according to claim 39 wherein said feedback MOS transistor has said predetermined maximum current capability is set by limiting a gate width of said feedback MOS transistor to a predetermined maximum value.

41. A circuit according to claim 39 wherein said ratio between the maximum current capability of the feedback MOS transistor and a current value extracted from the output node by the logic circuit means during the mode of logic operation is set to 0.6 or less.

42. A circuit according to claim 38 wherein said second potential source is 4.5 volts or less.

* * * * *